(12) United States Patent
Rusli

(10) Patent No.: US 10,586,746 B2
(45) Date of Patent: Mar. 10, 2020

(54) SEMICONDUCTOR DEVICE AND METHOD

(71) Applicant: CHIP SOLUTIONS, LLC, Phoenix, AZ (US)

(72) Inventor: Sukianto Rusli, Phoenix, AZ (US)

(73) Assignee: Chip Solutions, LLC, Phoenix, AZ (US)

( * ) Notice: Subject to any disclaimer, the term of this patent is extended or adjusted under 35 U.S.C. 154(b) by 0 days.

(21) Appl. No.: 15/705,567

(22) Filed: Sep. 15, 2017

(65) Prior Publication Data

US 2018/0025955 A1 Jan. 25, 2018

Related U.S. Application Data

(63) Continuation-in-part of application No. 15/405,700, filed on Jan. 13, 2017, now Pat. No. 9,922,949, which
(Continued)

(51) Int. Cl.
*H01L 21/56* (2006.01)
*H01L 21/67* (2006.01)
(Continued)

(52) U.S. Cl.
CPC ............ *H01L 23/13* (2013.01); *H01L 21/486* (2013.01); *H01L 21/565* (2013.01);
(Continued)

(58) Field of Classification Search
CPC ..... H01L 21/568; H01L 23/13; H01L 21/673; H01L 21/565; H01L 23/3114; H01L 22/30; H01L 21/67242; H01L 23/5226; H01L 21/486; H01L 2225/06513; H01L 23/3128; H01L 24/16; H01L 24/17; H01L 24/82; H01L 24/08; H01L 2224/82896; H01L 23/49894; H01L 2224/16227; H01L 23/3121; H01L 2221/68318; H01L 2221/68359; H01L 2221/68381; H01L 2221/68345; H01L 2224/16235; H01L 2224/81447; H01L 2224/81455; H01L 21/6835; H01L 21/563; H01L 21/4846; H01L 23/3107; H01L 2221/68372;
(Continued)

(56) References Cited

U.S. PATENT DOCUMENTS 6,140,702 A 10/2000 Efland et al.
6,157,084 A 12/2000 Hino et al.
(Continued)

FOREIGN PATENT DOCUMENTS

WO 2015073047 A1 5/2015

*Primary Examiner* — Jasmine J Clark
(74) *Attorney, Agent, or Firm* — Schmeiser, Olsen & Watts LLP

(57) ABSTRACT

Disclosed herein is a method for forming a semiconductor package. The method includes providing a first releasable chip carrier attached to a conductive layer. A circuit layer is formed on a surface of the conductive layer and a dielectric layer is applied over a surface of the circuit layer. A second releasable chip carrier is attached to a surface of the dielectric layer and the first releasable chip carrier is released from the conductive layer via facilitation of a first activating source. The circuitry of the circuit layer is operationally tested.

20 Claims, 32 Drawing Sheets

Related U.S. Application Data is a continuation-in-part of application No. 15/211,631, filed on Jul. 15, 2016, now Pat. No. 9,847,244, and a continuation-in-part of application No. 15/211,290, filed on Jul. 15, 2016, now Pat. No. 9,941,146, and a continuation-in-part of application No. 15/211,384, filed on Jul. 15, 2016, and a continuation-in-part of application No. 15/211,481, filed on Jul. 15, 2016, now Pat. No. 10,332,775.

(60) Provisional application No. 62/388,023, filed on Jan. 14, 2016.

(51) Int. Cl.
   *H01L 23/13* (2006.01)
   *H01L 21/673* (2006.01)
   *H01L 21/48* (2006.01)
   *H01L 21/66* (2006.01)
   *H01L 23/31* (2006.01)
   *H01L 23/498* (2006.01)
   *H01L 25/065* (2006.01)
   *H01L 23/522* (2006.01)
   *H01L 21/683* (2006.01)
   *H01L 23/00* (2006.01)

(52) U.S. Cl.
   CPC .......... *H01L 21/568* (2013.01); *H01L 21/673* (2013.01); *H01L 21/67242* (2013.01); *H01L 21/6835* (2013.01); *H01L 22/20* (2013.01); *H01L 22/30* (2013.01); *H01L 23/3114* (2013.01); *H01L 23/3121* (2013.01); *H01L 23/49816* (2013.01); *H01L 23/5226* (2013.01); *H01L 24/08* (2013.01); *H01L 24/17* (2013.01); *H01L 24/82* (2013.01); *H01L 25/0657* (2013.01); *H01L 22/14* (2013.01); *H01L 22/32* (2013.01); *H01L 23/3128* (2013.01); *H01L 23/49894* (2013.01); *H01L 24/16* (2013.01); *H01L 24/81* (2013.01); *H01L 2221/68318* (2013.01); *H01L 2221/68345* (2013.01); *H01L 2221/68359* (2013.01); *H01L 2221/68381* (2013.01); *H01L 2224/0801* (2013.01); *H01L 2224/08501* (2013.01); *H01L 2224/13147* (2013.01); *H01L 2224/16227* (2013.01); *H01L 2224/16235* (2013.01); *H01L 2224/81447* (2013.01); *H01L 2224/81455* (2013.01); *H01L 2224/821* (2013.01); *H01L 2224/82896* (2013.01); *H01L 2225/06513* (2013.01); *H01L 2924/15747* (2013.01)

(58) Field of Classification Search
   CPC .............. H01L 24/13; H01L 23/49827; H01L 23/49816; H01L 24/81; H01L 25/0657; H01L 2224/81193; H01L 2224/13155; H01L 2924/15747; H01L 22/14
   See application file for complete search history.

(56) References Cited

U.S. PATENT DOCUMENTS

| | | |
|---|---|---|
| 7,147,740 B2 | 12/2006 | Takayama et al. |
| 7,836,586 B2 | 11/2010 | Bayan et al. |
| 8,017,436 B1 * | 9/2011 | Huemoeller et al. ........................ H01L 21/4857 438/107 |
| 8,176,627 B2 | 5/2012 | Kobayashi |
| 2001/0041386 A1 | 11/2001 | Yasunaga |
| 2006/0223230 A1 | 10/2006 | Hsu et al. |
| 2006/0264004 A1 | 11/2006 | Tong et al. |
| 2008/0029890 A1 * | 2/2008 | Cheng ................. H01L 21/4853 257/739 |
| 2008/0202661 A1 | 8/2008 | Kobayashi |
| 2009/0140419 A1 | 6/2009 | Rhyner et al. |
| 2010/0051189 A1 | 3/2010 | Kawabata et al. |
| 2012/0049345 A1 | 3/2012 | Railkar et al. |
| 2012/0187568 A1 | 7/2012 | Lin et al. |
| 2014/0030471 A1 | 1/2014 | Otsubo |
| 2014/0110856 A1 | 4/2014 | Lin |
| 2015/0041993 A1 | 2/2015 | Palm |
| 2015/0366077 A1 | 12/2015 | Kawai et al. |

* cited by examiner

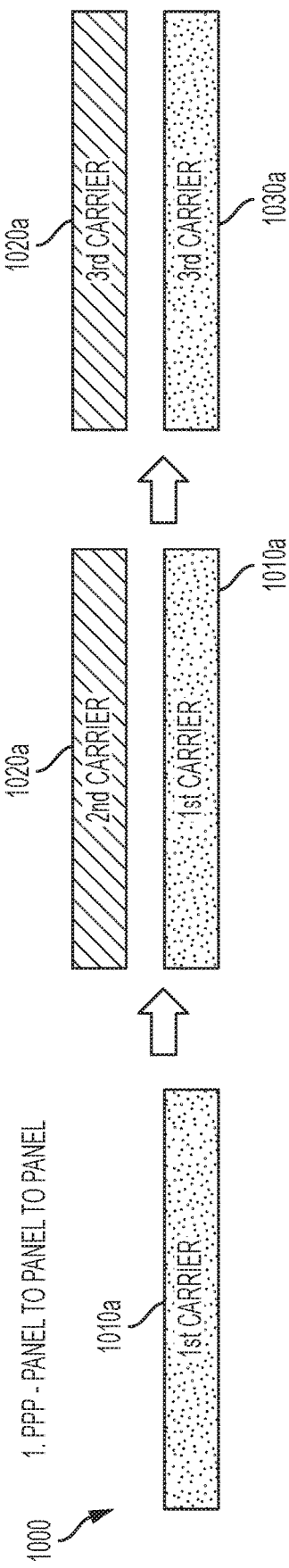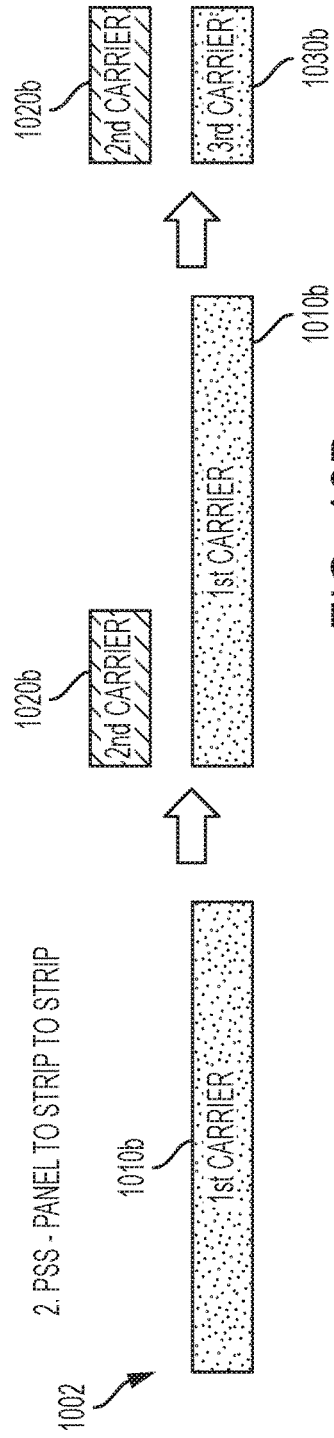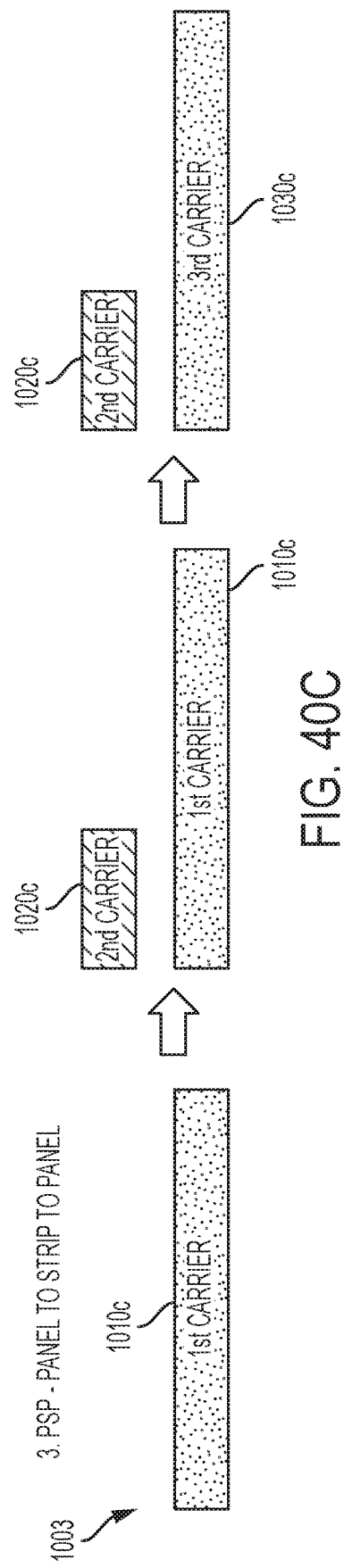

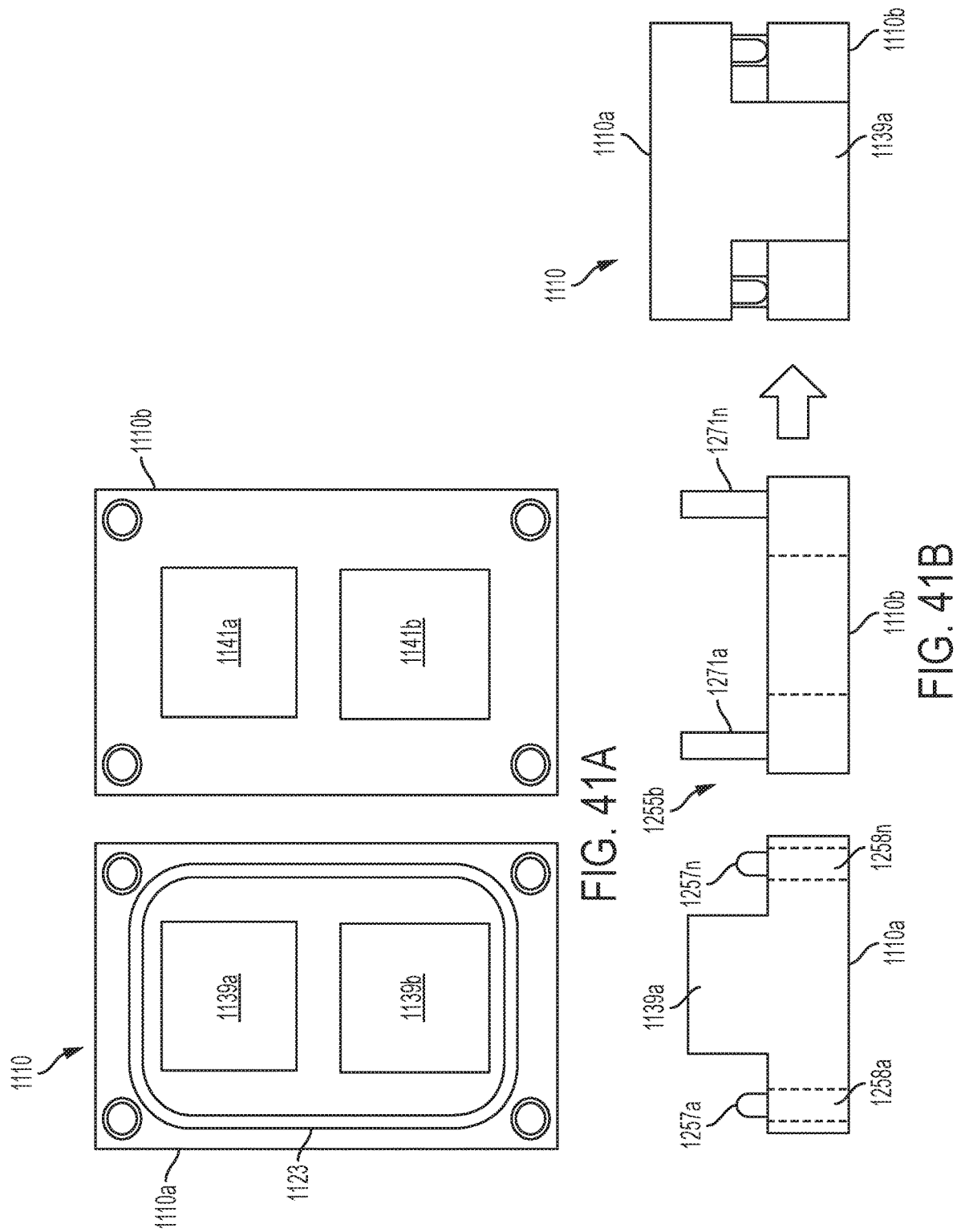

SEMICONDUCTOR DEVICE AND METHOD

CROSS-REFERENCE TO RELATED APPLICATIONS

This application is a continuation-in-part of U.S. Nonprovisional application Ser. No. 15/405,700, filed Jan. 13, 2017, now U.S. Pat. No. 9,922,949, which is a continuation-in-part of U.S. Nonprovisional application Ser. No. 15/211,631, filed Jul. 15, 2016, now U.S. Pat. No. 9,847,244; U.S. Nonprovisional application Ser. No. 15/211,290, filed Jul. 15, 2016, now U.S. Pat. No. 9,941,146; U.S. Nonprovisional application Ser. No. 15/211,384, filed Jul. 15, 2016; and U.S. Nonprovisional application Ser. No. 15/211,481, filed on Jul. 15, 2016, each of which claim priority to U.S. Provisional Patent Application No. 62/388,023 filed Jan. 14, 2016 and U.S. Provisional Application No. 62/231,814, filed Jul. 15, 2015; each of which is incorporated herein by reference in its entirety.

FIELD OF THE TECHNOLOGY

The subject matter disclosed herein generally relates to the fabrication of semiconductor devices. More particularly, the subject matter relates to a semiconductor device having a layered interconnect structure.

BACKGROUND

In known wafer level packaging (WLP) processes, a carrier wafer may be laminated to dicing tape and known good die are placed face down. The wafer may then be compression molded to encapsulate it and then the wafer carrier and tape may be removed. The molding compound may then be used to carry the fan-out area and to protect the chip backside. Redistribution layers may be created on the exposed die faces, the I/O may be rerouted, solder balls may be placed, and the die may be singulated. In other conventional non wafer level processes, methods include slicing the wafer into individual die and then packaging them.

Few semiconductor packaging and assembly techniques currently utilize embedded conductive circuits. When utilized, most embedded circuit implementations include a conductive circuit layer that is patterned onto a surface of a metal core base layer. A dielectric material is then layered onto the conductive circuit followed by the application of a thin layer of conductive layer. This foil is then etched to complete the circuit.

However, there are various limitations inherent in these known processes. Therefore, improved layering structures for semiconductor devices would be well received in the art.

SUMMARY

According to one embodiment, a method for forming a semiconductor package comprises: providing a first releasable chip carrier attached to a conductive layer; forming a circuit layer on a surface of the conductive layer; applying a dielectric layer over a surface of the circuit layer; attaching a second releasable chip carrier to a surface of the dielectric layer; releasing, via facilitation of a first activating source, the first releasable chip carrier from the conductive layer; and operationally testing circuitry of the circuit layer.

According to another embodiment, a method for forming semiconductor packages comprises: providing a first releasable chip carrier attached to a conductive layer; forming a circuit layer on a surface of the conductive layer; applying a dielectric layer over a surface of the circuit layer; attaching a second releasable chip carrier to a surface of the dielectric layer; releasing, via facilitation of a first activating source, the first releasable chip carrier from the conductive layer; and operationally testing first circuitry and second circuitry of the circuit layer.

According to another embodiment, a releasable carrier structure comprises: a first releasable chip carrier; a carrier conductive layer; a first releasable tape layer placed between the first releasable chip carrier and the carrier conductive layer, wherein the first releasable tape layer attaches the first releasable chip carrier to the carrier conductive layer, and wherein the first releasable tape layer is configured to release the first releasable chip carrier from the carrier conductive layer after being exposed to an activating source; a dielectric layer formed over a surface of a circuit layer formed over the carrier conductive layer; a second releasable chip carrier; and a second releasable tape layer placed between the second releasable chip carrier and the dielectric layer, wherein the second releasable tape layer attaches the second releasable chip carrier to the dielectric layer, and wherein the second releasable tape layer is configured to release the second releasable chip carrier from the dielectric layer after being exposed to the activating source.

The present invention advantageously provides a simple method and associated system for forming a semiconductor package.

BRIEF DESCRIPTION OF THE DRAWINGS

The subject matter which is regarded as the invention is particularly pointed out and distinctly claimed in the claims included at the conclusion of this specification. The foregoing and other features and advantages of the invention are apparent from the following detailed description taken in conjunction with the accompanying drawings in which:

FIG. 40a illustrates a first flow diagram associated with a carrier structure panel to panel to panel (PPP) format in accordance with one embodiment;

FIG. 40b illustrates a second flow diagram associated with a carrier structure panel to strip to strip (PSS) format in accordance with one embodiment;

FIG. 40C illustrates a third flow diagram associated with a carrier structure panel to strip to panel (PSP) format in accordance with one embodiment; and FIGS. 41A and 41B illustrate an embodiment of a second releasable chip carrier in accordance with one embodiment.

DETAILED DESCRIPTION

A detailed description of the hereinafter-described embodiments of the disclosed apparatus and method are presented herein by way of exemplification and not limitation with reference to the Figures.

Figure 1:
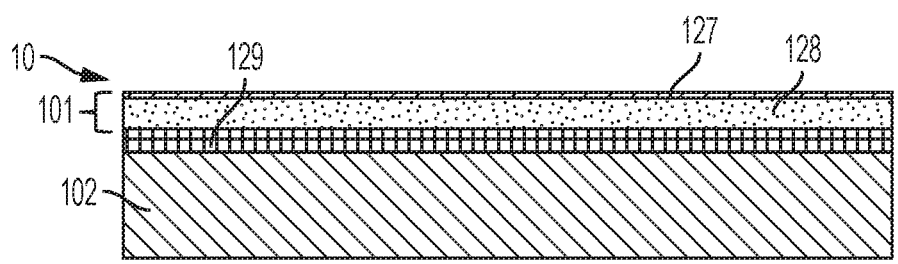
FIG. 1 depicts a side cutaway view of a step of a fabrication process according to one embodiment.
Figure 2:
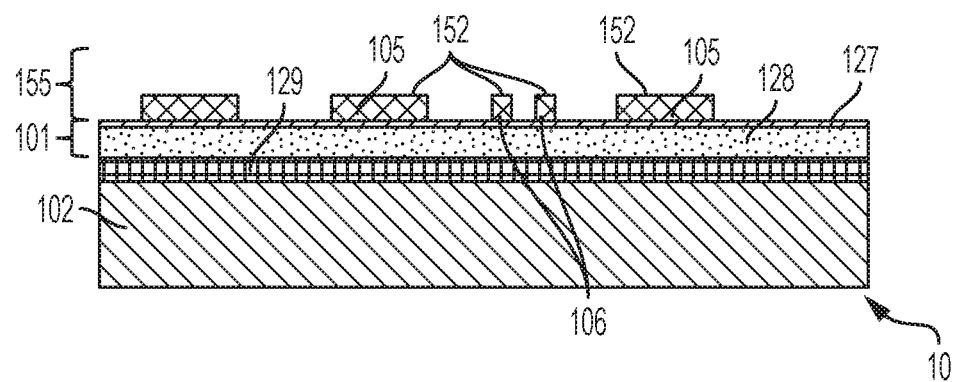
FIG. 2 depicts a side cutaway view of another step of the fabrication process of FIG. 1 according to one embodiment.

Referring to FIGS. 1-12, a fabrication process for the creation or fabrication of a semiconductor device 100 is shown. The fabrication process is shown in FIG. 1 to include a step of providing a releasable carrier 102 that is attached to conductive layers 101 to create a carrier structure 10. The conductive layers 101 may include a combination of a carrier foil 128 and a thin foil 127. The carrier foil 128 may be a thicker conductive layer and the thin foil 127 may be a thin conductive layer. An adhesive layer 129 may be located between the carrier 102 and the conductive layers 101. Embodiments of the releasable carrier 120 and the conductive layers 101 combination are shown in the exploded views provided by FIGS. 19-20.

Figure 18:
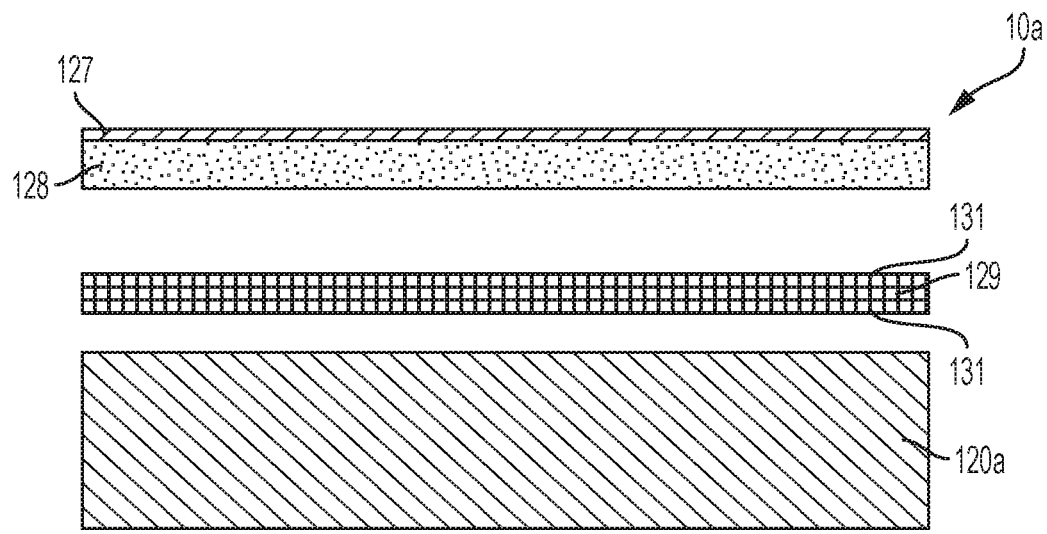
FIG. 18 depicts an exploded view of layers of a carrier structure in accordance with one embodiment.
Figure 19:
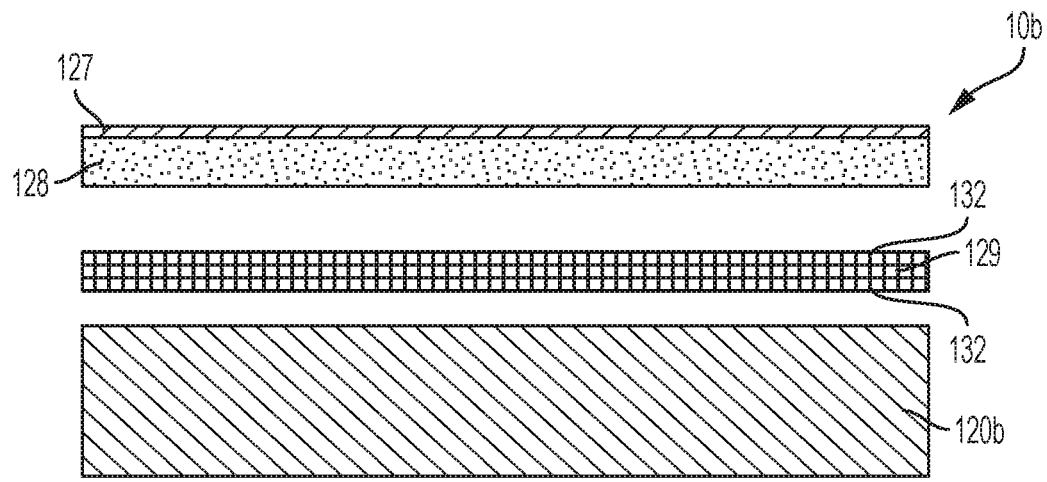
FIG. 19 depicts an exploded view of layers of another carrier structure in accordance with one embodiment.

FIG. 18 shows a carrier structure 10a having a releasable carrier 120 that may be a metal or core carrier 120a. FIG. 19 shows a carrier structure 10b having a glass releasable carrier 120b. Glass may be a preferred material for the releasable carrier 120 because it is extremely flat, thermally and dimensionally stable, and has a low coefficient of thermal expansion. However, other materials may have other advantages. The releasable carrier 120 may be a glass carrier, a metal core carrier, a clad core carrier, a laminate carrier, an aluminum carrier, a copper carrier, or a stainless steel carrier, an organic reinforced core carrier a ceramic material or combinations thereof. These carrier materials are exemplary. Further, the releasable carrier 120 may have varying thicknesses and may extend over varying areas. It should be understood that the concepts described herein may be applicable to any panel size format (e.g. 500 mm×500 mm). Further, the releasable carrier 120 may be a made from a material that is dimensionally stable, stiff and flat. These three characteristics may be particularly advantageous during the rest of the described fabrication process. Further, because the releasable carrier 120 may be reused for a second fabrication process after being released in the manner described herein, the releasable carrier 120 may be fashioned in a thicker manner, as the reusability of the releasable carrier 120 may preclude the engineering need to reduce material cost as would be required for one-off carriers.

To create or fabricate the carrier structure 10, the adhesive layer 129 may be applied to one of the releasable carrier 120 or the conductive layers 101 in a first step. The other of the releasable carrier 120 or the conductive layers 101 may then be attached. The adhesive layer 129 may include one or more layers such as a base with adhesive on one or both sides of the base (i.e. a double-sided tape).

As shown in FIG. 18, the adhesive layer 129 may include a thermal sensitive adhesive 131 on one or both sides of a double-sided tape. The thermal sensitive adhesive 131 may be configured to have a reduced adhesive capacity when exposed to high temperatures from, for example, a heat source. This may allow the thermal sensitive adhesive 131 to release when exposed to heat. For example, the activating heat source may be configured to raise the temperature of the thermal sensitive adhesive 131 to a temperature between 150 and 300° C. For example, in one embodiment, the temperature of the thermal activating source may be set to 250° C. with the release temperature of the thermal sensitive adhesive 131 being in the range of 180° C. and 220° C.

Figure 21:
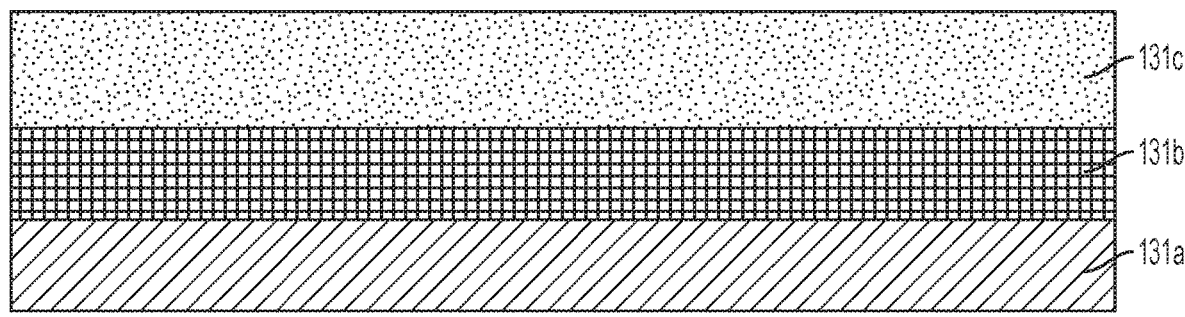
FIG. 21 depicts a thermal release film in accordance with one embodiment.
Figure 22:
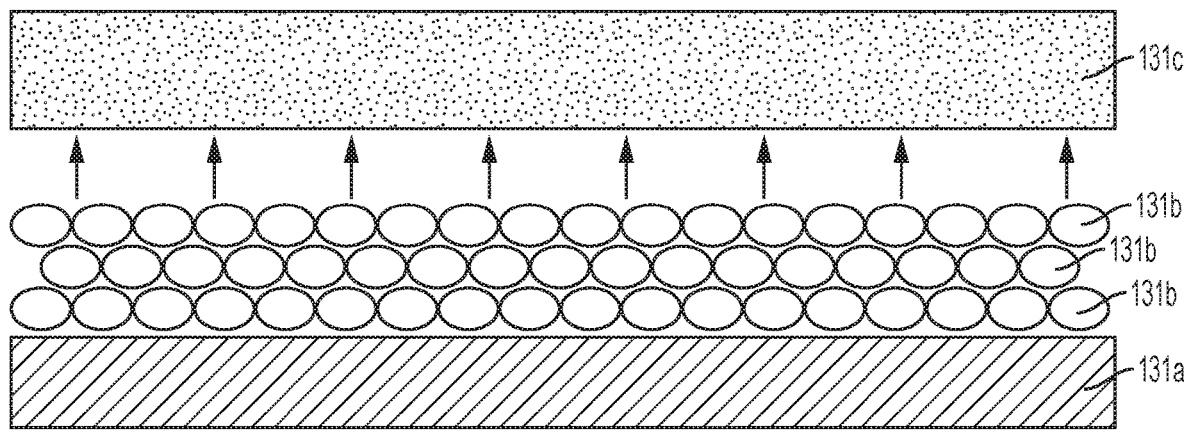
FIG. 22 depicts the thermal release film of FIG. 21 after activation in accordance with one embodiment.

One embodiment of a structure of the thermal sensitive adhesive 131 is shown in FIGS. 21 and 22. FIG. 21 shows the thermal sensitive adhesive 131 prior to activation. FIG. 22 shows the thermal sensitive adhesive 131 after activation. The thermal sensitive adhesive 131 may include a backing layer 131*a*. A thermal release adhesive layer 131*b* may be layered above the backing layer 131*a*. A substrate layer 131*c* may be attached to the thermal release adhesive layer 131*b*. The substrate layer 131*c* may be any particular substrate such a release film liner. Thus, the thermal release adhesive layer 131 may be activated by heat from a heat source to create the release. The thermal release adhesive layer 131*b* may include expandable molecules that expand when exposed to increased temperatures. Such expansion may reduce the tendency for adhesion of the molecules to provide for the thermal release of the thermal sensitive adhesive 131.

Alternatively, the adhesive layer 129 may include a UV sensitive adhesive 132 on one or each side of a double-sided tape, as shown in FIG. 19. The UV sensitive adhesive 132 may be configured to have a reduced adhesive capacity when exposed to a UV light source. This may allow the UV sensitive adhesive 132 to release when exposed to the UV light source. For example, the UV light activation source (not shown) may be a UV light source generating irradiation energy between 20 mW/cm$^2$ and 40 mW/cm$^2$. In the embodiment where a UV sensitive adhesive is utilized, it may be particularly advantageous to use a glass material for the releasable carrier 120. The transparent nature of glass may allow the UV sensitive adhesive to be exposed to the UV light activation source through the glass of the releasable carrier 120.

Figure 20:
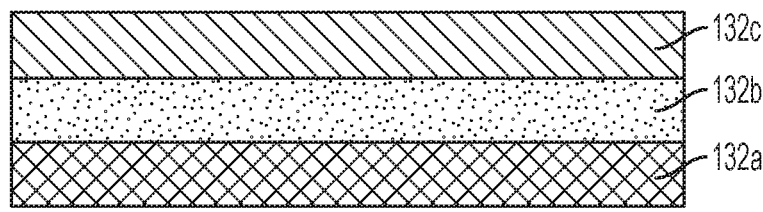
FIG. 20 depicts a UV release film in accordance with one embodiment.

One embodiment of a structure of the UV sensitive adhesive 132 is shown in FIG. 20. The UV sensitive adhesive 132 may include a polyolefin film layer 132*a*. A UV curing acrylic adhesive layer 132*b* may be layered above the polyolefin film layer 132*a*. A polyester film release liner 132*c* may be layered above the UV curing acrylic adhesive layer 132*b*. Thus, the UV curing acrylic adhesive layer 132*b* may be the layer that is activated by the UV source to create the release from the liner layers 132*a*, 132*c*. The thickness of the middle UV curing acrylic adhesive layer 132*b* may be thinner than the liner layers 132*a*, 132*c*. In one embodiment, the UV curing acrylic adhesive layer 132*b* may be 3-10 μm, while the combination of the liner layers 132*a*, 132*c* may each be 60-100 μm. In one embodiment, the UV curing acrylic adhesive layer 132*b* may be 8 μm or 5 μm while the liner layers 132*a* may be 80 μm.

In other embodiments, the double-sided tape may include two different adhesives, one on each side. For example, the double-sided tape may include a thermal sensitive adhesive on one side and a UV sensitive adhesive on the other. In still another embodiment, the double-sided tape may include a UV sensitive adhesive on one side and a no-release adhesive on the other side. In another embodiment, a pressure sensitive adhesive may be applied to one side of the double-sided tape while the other side includes the UV sensitive adhesive or the thermal sensitive adhesive. It should be understood that different adhesive combinations are contemplated for the double-sided tape in order to accomplish different release circumstances depending on the engineering requirements of a particular process or fabrication.

Attached to the releasable carrier 120 with the adhesive layer 129 are the conductive layers 101. The conductive layers 101 may include both the carrier foil 128 and the thin foil 127. The carrier foil 128 may be releasable from the thin foil 127 by mechanically pulling the carrier foil 128 from the thin foil 127 to expose the thin foil 127. In other embodiments, adhesives or a double-sided tape may be applied between the carrier foil 128 and the thin foil 127 which may release the carrier foil 128 from the thin foil 127 in a manner similar or the same as the releasable carrier 120 releases from the conductive layers 101 with the adhesive layer 129. The carrier foil 128 may be a thicker layer than the thin foil 127. In one embodiment, the carrier foil 128 may be 50 μm-70 μm. In one embodiment, the thin foil 127 may be between 1 μm and 5 μm. However, these thicknesses are exemplary and thicker or thinner layers may be appropriate in some embodiments.

Figure 29:
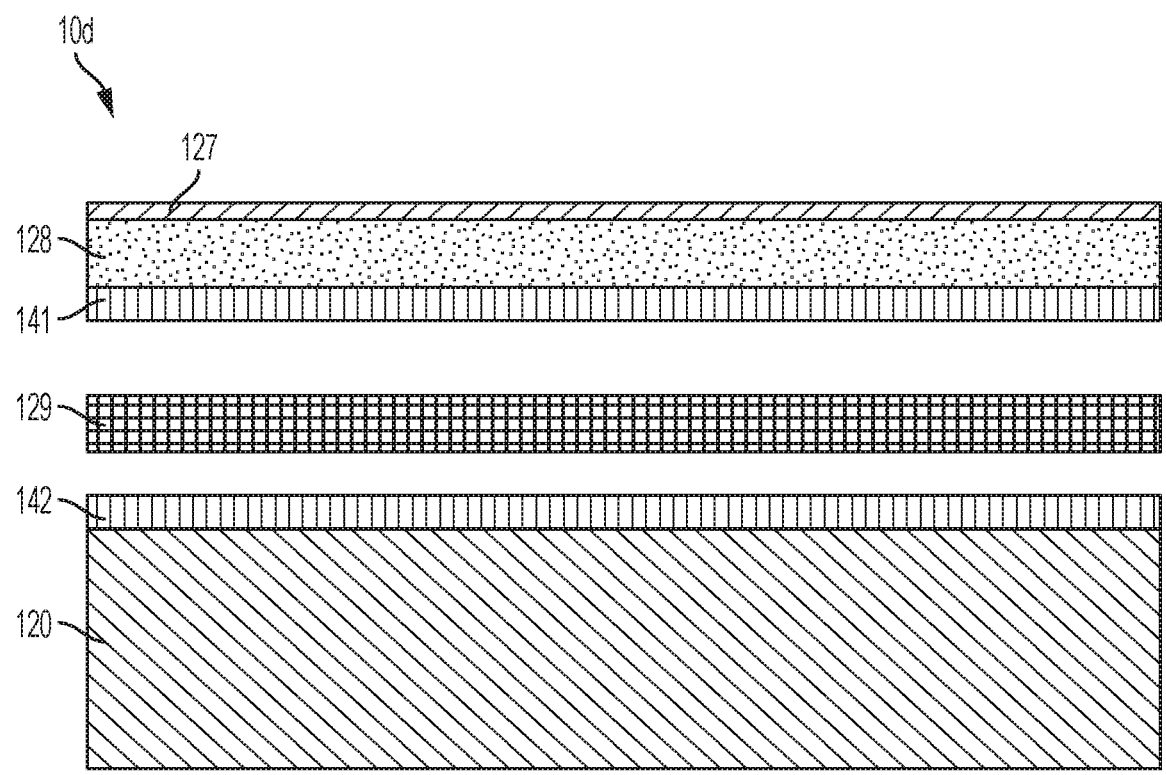
FIG. 29 depicts an exploded view of layers of another carrier structure in accordance with one embodiment.
Figure 30:
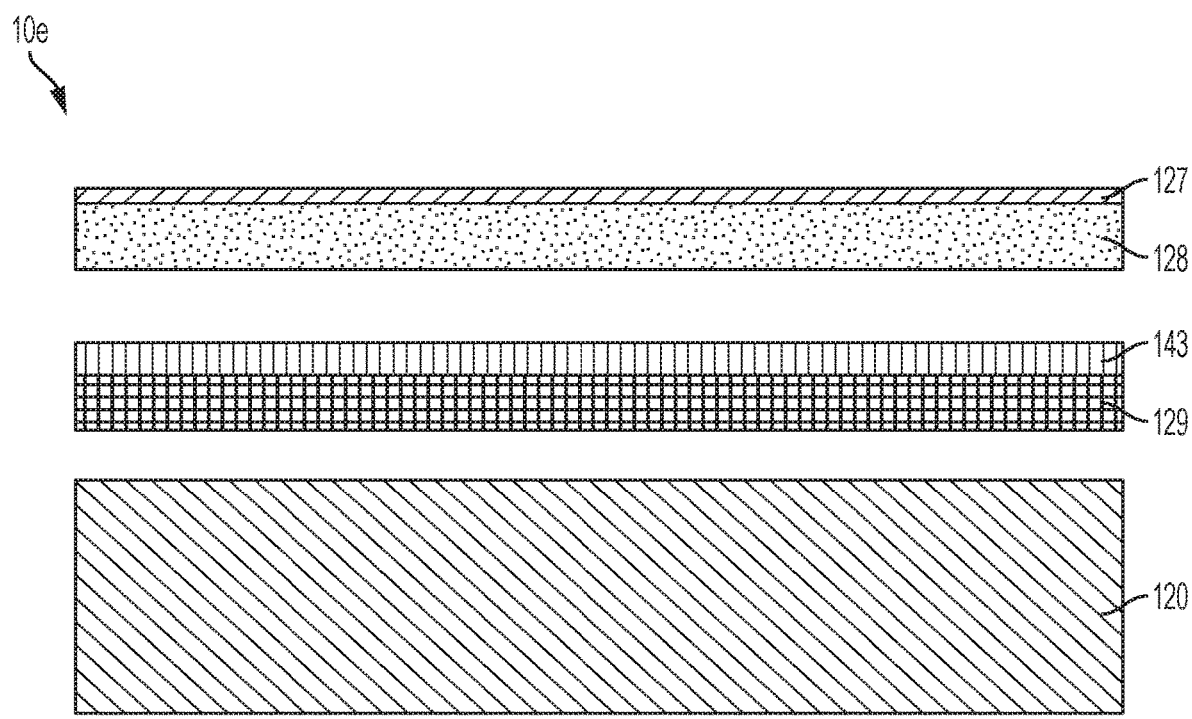
FIG. 30 depicts an exploded view of layers of another carrier structure in accordance with one embodiment.

Referring now to FIG. 29, still another embodiment of a carrier structure 10*d* is shown whereby the releasable carrier 120 includes a thermal barrier coating 142 applied to the releasable carrier 120 between the releaseable carrier 120 and the adhesive layer 129. The thermal barrier coating 142 may be configured to prevent the loss of adhesion for the adhesive layer 129 as a result of elevated temperatures that might occur in other steps of the assembly processing (e.g. during reflow). Furthermore, FIG. 29 shows that a second barrier release coating 141 is applied to the carrier foil 128 between the carrier foil 128 and the adhesive layer 129. Another barrier release coating (not shown) may be applied to an undersurface of the carrier as well to act as a thermal barrier at this location in the carrier structure. Referring to FIG. 30, another embodiment is shown where a third thermal barrier coating 143 is applied to the top of the adhesive layer 129 between the adhesive layer 129 and the carrier foil 128.

The thermal barrier coatings 141, 142, 143 may be applied as a layer between any release interface in the carrier structure 10. Both sides of the adhesive layer 129 may include a thermal barrier coating. The thermal barrier coatings 141, 142, 143 may be micron size fillers that may be applied to appropriate layers of the carrier structure 10 and more specifically the adhesive layer 129. These filler particles may be hollow ceramic insulative spheres in one embodiment. The thermal barrier coatings 141, 142, 143 may be adjusted to the desired thickness to provide the necessary protection for the layers of the carrier structure 10 and the thermal sensitive adhesive 131 (or the UV, pressure sensitive, or other adhesives described above). The thermal barrier coatings 141, 142, 143 may be applied by various methods such as thermal spray.

Figure 25:
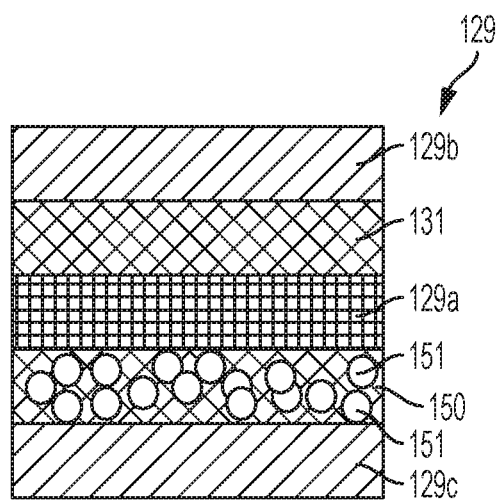
FIG. 25 depicts a thermal adhesive tape in accordance with one embodiment.

Referring to FIG. 25, it is contemplated that the thermal barrier material may be combined or mixed with an adhesive in a combined adhesive/barrier layer, rather than two separate layers. In this embodiment, a version of the adhesive layer 129 is shown including a double sided tape having a polyester base material layer 129a located between a thermal sensitive adhesive 131 and a pressure sensitive adhesive 150. The pressure sensitive adhesive 150 may include thermal barrier fillers 151 in a combined manner. The thermal barrier fillers 151 may be mixed with the pressure sensitive adhesive 150. The thermal barrier fillers 151 may be formulated in the form of hollow ceramic spheres in one embodiment that may be configured to act as an insulator. These thermal barrier fillers 151 may be mixed with any of the adhesives (thermal, UV, pressure) in this manner. In this version the double sided tape further includes a first release liner 129b layered on top of the thermal release adhesive 131 and a second release liner 129c layered below the pressure sensitive adhesive 150. These release liners 129b, 129c may be utilized on any embodiment of the carrier structure 10 described herein and may be removed when applying the double sided tape to the carrier structure 10 during the fashioning of the carrier structure 10 prior to a circuit or semiconductor device fabrication process.

Whatever the embodiment, the releasable carrier 120 may be configured to release from the rest of the carrier structure 10 from the conductive layers 101 when exposed to an activating source, such as a UV source or a heat source as described herein above. The activating source may require no physical contact with the releasable carrier 120 to activate the adhesive layer 129 and release the releasable carrier in a manner consistent with that described herein. Further, the activating source may be a non-mechanical activating source and may create a clean release such that the releasable carrier 120 is reusable for additional fabrication processes. Further, the releasable carrier 120 may include three release points: a first release point between the thin foil 127 and the carrier foil 128; a second release point between the carrier foil 128 and the adhesive layer 129 or releasable tape; and a third between the releasable carrier 120 and the adhesive layer 129 or releasable tape.

It should further be understood that the carrier structures described herein may be used on any panel size or format, from wafer to large panel processes. Further the carrier structures described herein may be used on standard build up processes or sputtering methods. Further, the carrier structures may expand fan out wafer level packaging to sizes beyond the current 12" diameter standard. Moreover, the carrier structures may be capable for any panel size format including rectangular, square or circular. Further, the carrier structures and accompanying methods described herein may be compatible with wirebond, flip chip, integrated passive devices, conventional passives and multi-die structures.

Referring back to the process of FIGS. 1-12, FIG. 2 shows another step in the fabrication process. Once the releasable carrier 120 has been provided (with or without the openings 103), a substrate 155 may begin to be built upon the releasable carrier 120, as shown in FIGS. 3-6. In the first step of building this substrate 155, shown in FIG. 3, a conductive circuit 152 may be applied. The conductive circuit 152 may include a plurality of die attach pads 105 and a plurality of traces 106. The die attach pads 105 and the traces 106 may each be plated conductive elements. The conductive circuit 152 may be applied atop the layer of the thin foil 127 while the releasable carrier 120 remains attached. The conductive circuit 152 is not limited to these elements and may include any appropriate conductive elements, portions or the like. The conductive circuit 152 may be a redistribution layer (RDL) and may be formed with RDL patterning with semi-additive plating.

Figure 3:
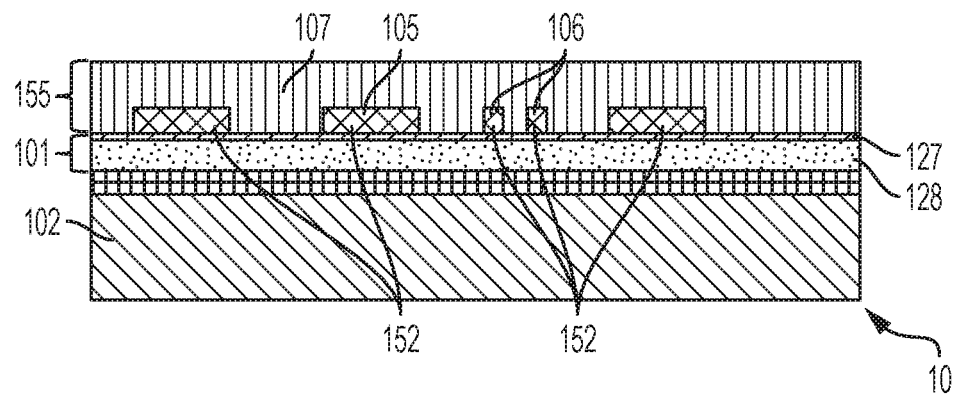
FIG. 3 depicts a side cutaway view of another step of the fabrication process of FIGS. 1-2 according to one embodiment.

Referring now to FIG. 3, another step of the fabrication process is shown. The fourth step includes laminating the conductive circuit 152 with an insulative material 107 to encapsulate the conductive circuit 152. The insulative material 107 may be a photo-imageable dielectric (PID) in one embodiment. In others, the insulative material 107 may be an ABF film. In still other embodiments, as described herein below with respect to FIG. 26, the insulative material 107 may be a mold compound. The insulative material may be any dielectric material used for creating substrate layers on conductive circuits for semiconductor and printed circuit board (PCB) processes. The insulative material 107 may have an adjustable thickness depending on the embodiment.

It should be understood that the conductive circuit 152 may be referred to herein as an "embedded circuit." "Embedded," as defined herein, means a process or product where a conductive circuit or layer is built in adjacent contact with a conductive layer, the conductive layer being etched away or otherwise removed to complete the conductive circuit of the substrate. Prior to etching, the thin foil sheet would short any circuit upon which the embedded substrate is built. In each of these "embedding" processes, the conductive layer is etched away to complete the functional conductive circuit.

Figure 4:
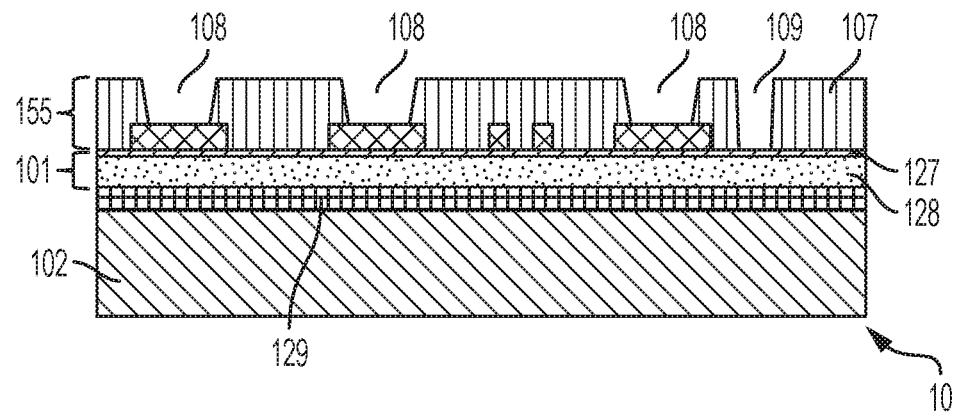
FIG. 4 depicts a side cutaway view of another step of the fabrication process of FIGS. 1-3 according to one embodiment.

Referring now to FIG. 4, another step of the fabrication process is shown. At this stage, the insulative material 107 (e.g. PID) may be patterned. The patterning of the insulative material 107 may include one or more patterned structures 108 exposing a die attach pads 105 or patterned structures 109 exposing the thin conductive layer 127. As shown, multi-tier openings may be defined in the insulative material 107. The chip 112 (shown in FIG. 6) may also be placed on this stage with solder balls or copper pillars connecting to the circuits 152 within the patterned structures 108. Alternatively, the chip 112 may be placed as shown in FIG. 6.

Figure 5:
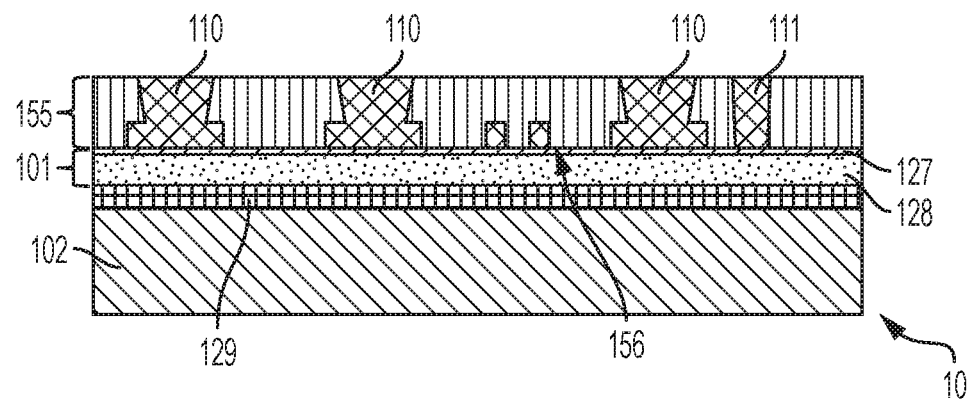
FIG. 5 depicts a side cutaway view of another step of the fabrication process of FIGS. 1-4 according to one embodiment.

In FIG. 5, another step of the fabrication process is shown where the patterned structures 108, 109 may be filled with more conductive material, such as copper. In the embodiment shown, a plurality of copper plated filled vias 110 are shown filling the patterned structures 108. A copper plated structure 111 above the unpatterned thin foil 127 filled the patterned structure 109. The structures 110, 111 are each flush with the surface of the insulative material 107. At this point, the completed substrate layer 155 has been defined above the layer of thin foil 127. The substrate 155 includes a first surface 156 and a second surface 157. From here, it should be understood that multi-layer circuits may be fabricated above the substrate layer 155 by repeating the circuit patterning process using known build up or transfer methods. The embodiment described in FIGS. 1-12 includes the single substrate 155 but it should be understood that this is exemplary.

Once the substrate layer 155 is completed, before the next step, the electrical and/or mechanical properties of each die attach location may be tested or viewed with a vision system to determine good known die attach locations. This vision testing may be accomplished before the conductive circuit 152 is etched or completed and while the thin foil layer 127 remains attached. The insulative layer 107 may be comprised of PID material to facilitate the imaging at this stage prior to attachment of the semiconductor die 112. The imaging may determine whether the elements of the conductive circuit are ready for placement or are instead defective. It should be understood that the view shown in FIGS. 1-12 are for a single die attach location, but that the substrate may continue to the left and right (along with into and out of the page) relative to the cross section shown to provide for additional die attach locations.

Figure 6:
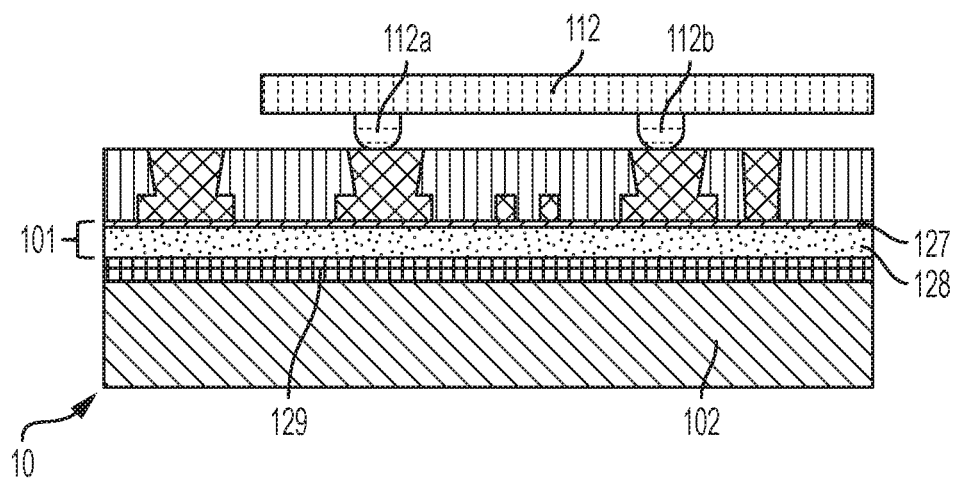
FIG. 6 depicts a side cutaway view of another step of the fabrication process of FIGS. 1-5 according to one embodiment.

Referring now to FIG. 6, a semiconductor die 112 may then be attached to the second surface 157 of the substrate layer 155. The semiconductor die 112 may be a flip chip or any other type of die and may include interconnects 112a, 112b. The interconnects 112a, 112b may be copper pillars or solder balls. The die placement and die redistribution of the semiconductor die 112 may be completed using pick and place tools. However, other die attach techniques may be required depending on the die pitch design and corresponding registration requirement. Flux application by dipping may also be incorporated during the pick and place. Other flux dispensing methods are possible in the placement process as well. Reflow may include utilizing a non conveyorized convection oven for large panel processes.

Thus, the conductive circuit 152 may include a first element 160 having a first portion such as the structure 110 in physical contact with the semiconductor die 112 and at least substantially coplanar with the second surface 157 of the insulative material and the substrate 155. The first element 160 may further include a second portion such as the structure 105 that is at least substantially co-planer with the first surface 156 of the substrate 155. The first structure 110 and the second structure 105 may have different geometries.

Figure 7:
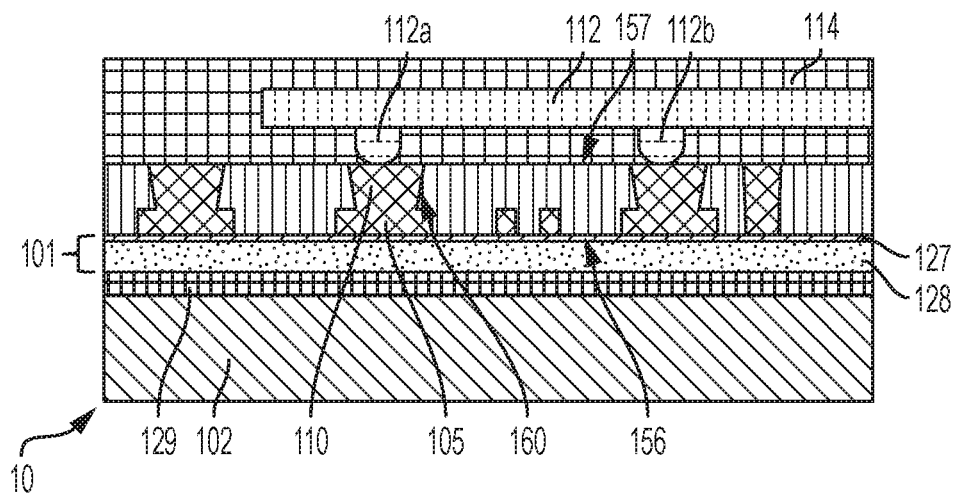
FIG. 7 depicts a side cutaway view of another step of the fabrication process of FIGS. 1-6 according to one embodiment.

Referring now to FIG. 7, another step of the fabrication process is shown. The eighth step may include molding the die onto the substrate 155 and the carrier structure 10 with a mold compound 114. Mold sheets, powder or liquid molding compounds or systems may be used depending on the package requirements for the mold compound 114. Capilary underfill (CUF) is also an option rather than mold underfill (MUF). The mold compound 114 encapsulating the semiconductor die 112 may be a dielectric material instead of a mold material (e.g. ABF film), in other embodiments. Thus, the semiconductor die 112 may be attached to the substrate 155 and encapsulated with the mold 114 before the releasable carrier 120 is removed from the substrate 155 and the conductive layers 101.

Figure 8:
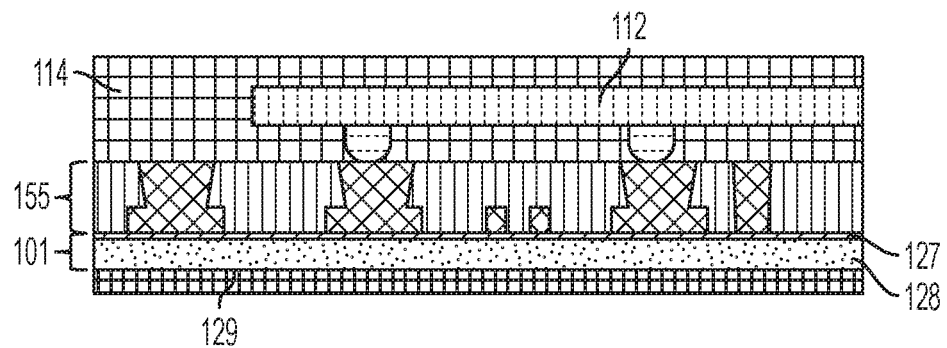
FIG. 8 depicts a side cutaway view of another step of the fabrication process of FIGS. 1-7 according to one embodiment.

Referring to FIG. 8, the next step may include releasing the releasable carrier 120 from the conductive layers 101 and the substrate 155. The releasable carrier 120 may be removed by peeling. However, the release of the releasable carrier 120 may be facilitated by an activating source as described hereinabove. Thus, no mechanical peeling may be necessary if the level of adhesive is reduced to the point where the carrier 120 falls away from the conductive layers 101 and the substrate 155.

Figure 9:
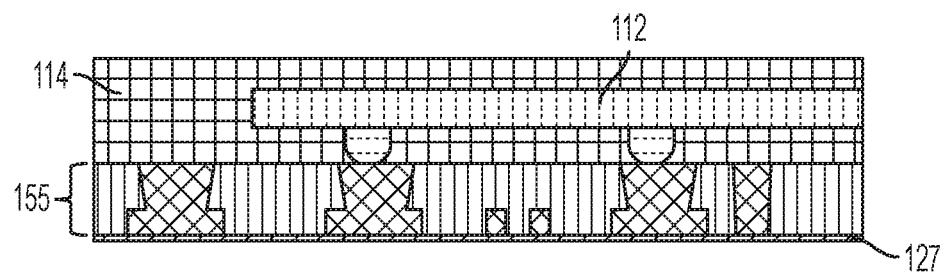
FIG. 9 depicts a side cutaway view of another step of the fabrication process of FIGS. 1-8 according to one embodiment.

Referring now to FIG. 9, once the releasable carrier 120 is released from the conductive layers 101, the carrier foil 128 may be released from the thin foil 127. This may be accomplished by peeling. Because the carrier foil 128 may be thin relative to the releasable carrier 120 and may not require release facilitation with an activating source like the releasable carrier 120.

Figure 10:
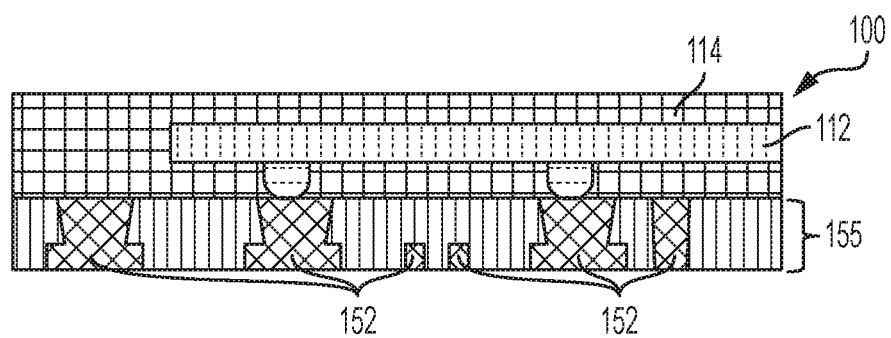
FIG. 10 depicts a side cutaway view of another step of the fabrication process of FIGS. 1-9 according to one embodiment.

As shown in FIG. 10, once the assembled package is separated from the releasable carrier 120, the remaining thin foil 127 may be removed by etching to expose the embedded RLD circuits in the insulative material 107 in a tenth step in the fabrication process. This etching may form an etched layer 158 of the thin foil 127 conductive material. Thus, at this stage the conductive circuit 152 and the etched layer 158 form a completed circuit. The etching may be a control etching process that may completed to form or complete the embedded circuits in the substrate layer 155. Thus, the conductive circuit 152 may be formed as a result of the RDL circuit build up on the thin foil 127 which is then encapsulated by the insulative material such as a PID, an ABF film, prepreg, and mold compound. The embedded RDL circuits including die pads may then be completely formed and exposed after the releasable carrier 120 has been removed and the thin foil 127 that remains below the dielectric layer is etched away, as shown in FIG. 10.

Figure 11:
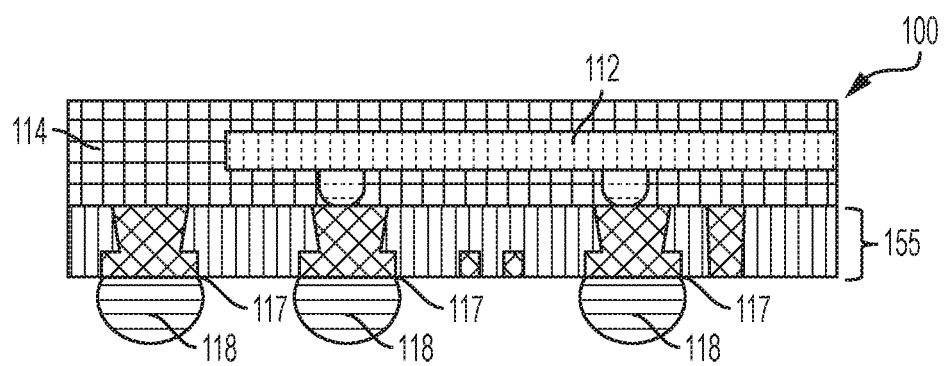
FIG. 11 depicts a side cutaway view of another step of the fabrication process of FIGS. 1-10 according to one embodiment.
Figure 12:
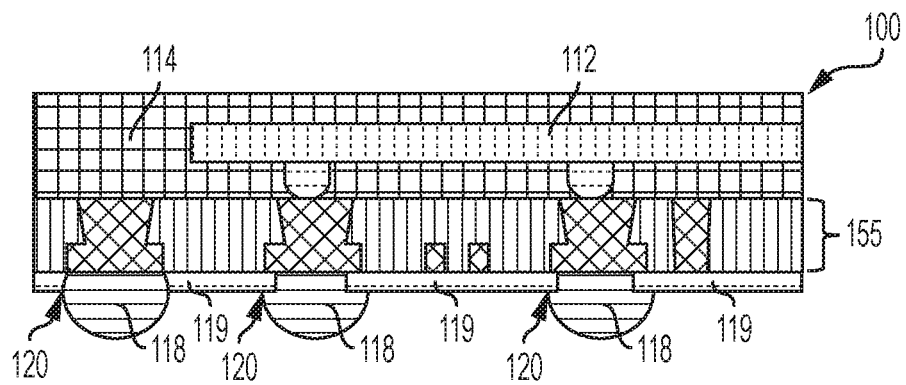
FIG. 12 depicts a side cutaway view of another step of the fabrication process of FIGS. 1-11 according to one embodiment.

Referring now to FIGS. 11 and 12, the recessed embedded circuit 152 may form an opening for a ball grid array (BGA) ball attach process for completing the semiconductor device 100. In FIG. 11, the etched circuits may include solder ball attach locations 117 without solder masks for attachment to solder balls 118. In FIG. 12, the etched circuits may include solder mask defined (SMD) BGA ball attach. In particular, a solder mask material 119 may be applied in a manner creating a defined opening 120 for the solder balls 118.

Thus, the fabrication process described with respect to FIGS. 1-12 may be a hybrid assembly process, whereby the build-up and creation of the substrate 155 and the conductive circuit 152 are fabricated at the same time and location as the semiconductor die 112 is attached to the substrate 155. This process may create a completed semiconductor device 100 at the same time and in the same location. With the described hybrid assembly process, the substrate fabrication and the assembly process steps of attaching the semiconductor die 112 may be seamless and may occur on the same manufacturing line or by a single manufacturer. However, it should be understood that the carrier structure 10 may be utilized in other standard non-hybrid approaches as well.

It should be understood that the above steps described with respect to FIGS. 1-12 are an exemplary embodiment and that other fabrication processes which utilizes more, less or different steps are contemplated. For example, the carrier structure 10 may be utilized in the manner described in FIGS. 9-10 (e.g. using a thermal or UV adhesive) using a variety of different fabrication and packaging processes both before and after the release of the releasable carrier 120. Likewise, the concept of attaching the semiconductor die 112 prior to the underlying conductive circuit 152 being completed (i.e. before etching and/or before additional layers of substrate are applied) may be applicable in various other fabrication processes.

Further, the carrier structure 10 may be configured to allow for separation in a timely release sequence. The concept allows for separation at certain predetermined or preplanned stages in an assembly or fabrication process. In the embodiment above, the carrier structure 10 goes through RDL circuit patterning, dielectric build up, lamination and assembly (flip chip attach and molding). The phase where the releasable carrier 120 is separated from the package is after the molding process of the semiconductor die 112. The adhesive layer 129 or double sided tape is configured to maintain adhesion as the carrier goes through different processes, especially during heating steps such as reflow processes.

At this point in the process, the semiconductor die 112 is attached to the embedded substrate 155. The embedded substrate 155 has the first surface 156 and the second surface 157. The embedded substrate 155 includes the insulator layer 107 and at least a portion of a conductive circuit 152 within the insulator layer 107. The embedded substrate includes the etched layer 158 of the conductive etched thin foil 127. The etched layer 158 may be attached to the conductive circuit 152. The semiconductor die 112 is attached to the second surface 157 while the etched layer 158 of the conductive material is attached to the opposing first surface 156.

Thus, disclosed herein is a method for making a semiconductor device, such as the semiconductor device 100. The method may include patterning a conductive circuit, such as the conductive circuit 152 on a conductive layer, such as the thin foil 127. The method may include applying an insulator material, such as the insulative material 107, over the conductive circuit to create a substrate, such as the substrate 155, having a first surface and a second opposing surface, where the conductive layer is located on the first surface. The method may include attaching a semiconductor die, such as the semiconductor die 112, to the second surface of the substrate. The method may then include etching or removing the conductive layer to create a completed circuit. The method may include providing a releasable carrier, such as the releasable carrier 120, attached directly or indirectly to the conductive layer, encapsulating the semiconductor die after the attaching the semiconductor die, and removing the releasable carrier from the conductive layer after the encapsulating of the semiconductor die.

Another embodiment may include a method for making a semiconductor device, such as the semiconductor device 100. The method may include providing a releasable carrier, such as the releasable carrier 120, attached to a conductive layer, such as the thin foil 127. The method may include patterning a conductive circuit, such as the conductive circuit 152, on a surface of the conductive layer. The method may include applying an insulative material, such as the insulative material 107, at least partially covering the conductive circuit. The method may include releasing the releasable carrier from the conductive layer and facilitating the releasing with an activating source. This facilitating may occur without the activating source making physical contact with the releasable carrier. The method may include raising the temperature of an adhesive, such as the adhesive layer 129, located between the releasable carrier and the conductive layer, to a temperature between 150° C. and 300° C. The method may include attaching a semiconductor die, such as the semiconductor die 112, to at least portions of the conductive circuit. The method may include encapsulating the semiconductor die before the releasing the releasable carrier. The method may further include including activating the adhesive with the activating source to facilitate the releasing. The method may further include applying thermal release adhesive on one or both sides of a double sided tape of the adhesive. The method may alternatively or additionally include applying UV release on one or both sides of the double sided tape. Still further, the method may include removing the carrier foil layer from the thin foil layer after the releasable carrier has been released. Moreover, the method may include reusing the releasable carrier for making a second semiconductor device.

Figure 13:
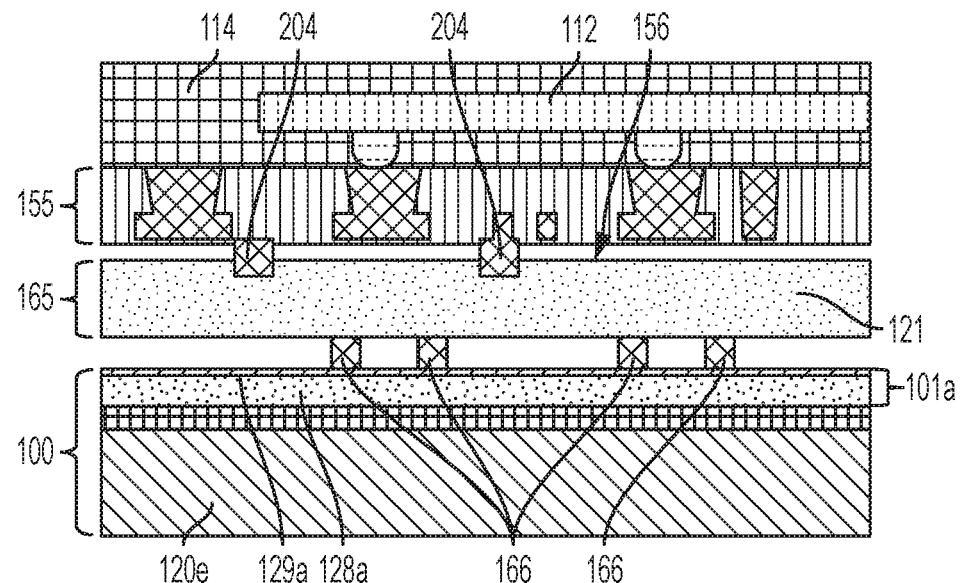
FIG. 13 depicts a side cutaway view of another step of a fabrication process according to one embodiment.
Figure 14:
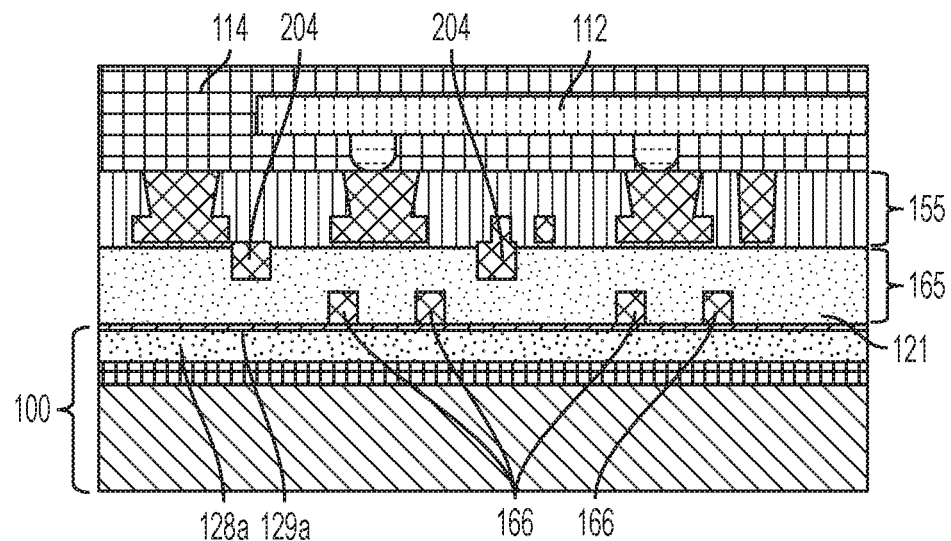
FIG. 14 depicts a side cutaway view of another step of the fabrication process of FIG. 13 according to one embodiment.
Figure 15:
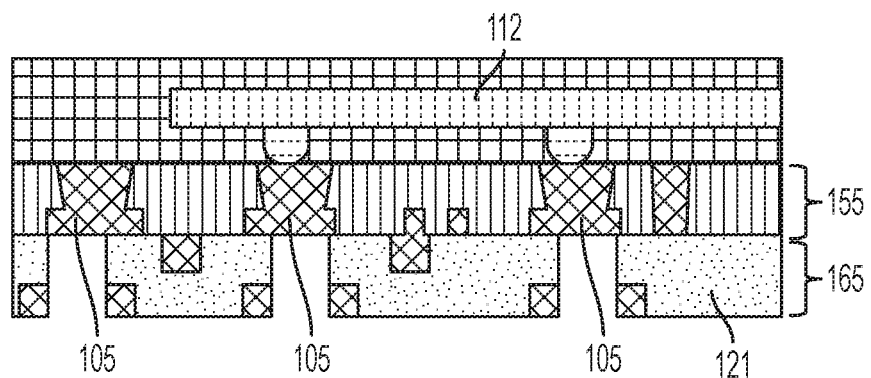
FIG. 15 depicts a side cutaway view of another step of the fabrication process of FIGS. 13-14 according to one embodiment.
Figure 16:
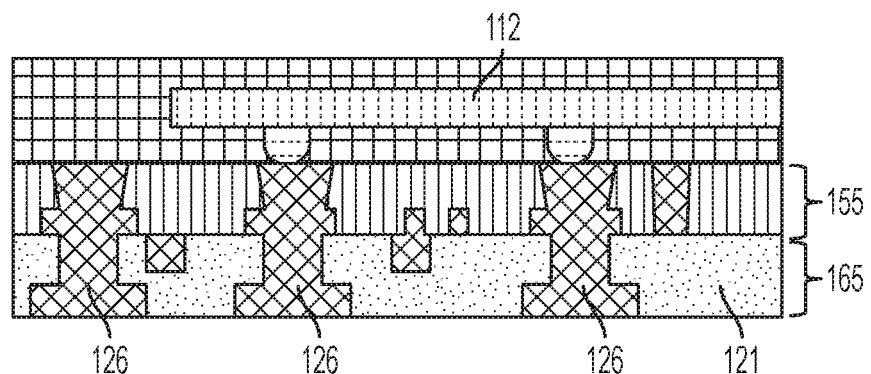
FIG. 16 depicts a side cutaway view of another step of the fabrication process of FIGS. 13-15 according to one embodiment.

Referring now to FIGS. 13-16 it is contemplated that the fabrication process may forgo steps 11 and 12 until after applying one or more additional substrate layers such as the second substrate layer 165 shown in FIGS. 13-14. In this process multi-substrate process, the semiconductor die 112 may be attached directly to the circuit pads at the structures 110 without removing the releasable carrier 120. If additional RDL layers are necessary, they may be formed by transfer process or by a build-up process after the releasable carrier 120 is removed as shown in FIGS. 13-16. FIG. 13 shows another carrier structure 10e similar or the same as the carrier structure 10. Here, an above plane circuit 204 may have already been applied adjacent or above the first surface 156, along with another insulative layer 121 which may include, for example, a thermal cure dielectric. The carrier structure 10e may include an annular ring structure 166 patterned on the conductive layers 101a. The thermal cure dielectric may be compressed, as shown in FIG. 14. Referring to FIG. 15, the releasable carrier 120e of the carrier structure 10a has been removed, along with the carrier foil layer 128a, exposing the thin foil layer 129a, which has already been etched away. Laser ablate has been used to remove portions of the insulative material and to expose the top pads 105 in the first substrate 155. Vias 126 are filled with a conductive material in the step shown in FIG. 16. It should be understood that following the step shown in FIG. 16, additional layers may be similarly applied. Furthermore, build-up layers by transfer method without a releasable carrier may be applied as well.

Figure 23A:
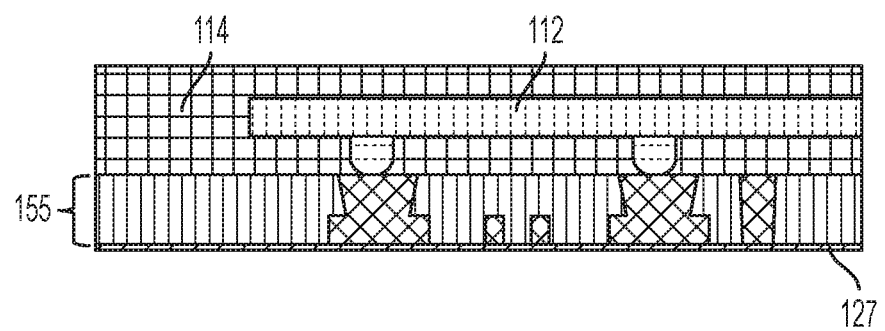
FIG. 23a depicts a side cutaway view of a step of a fabrication process in accordance with one embodiment.
Figure 23B:
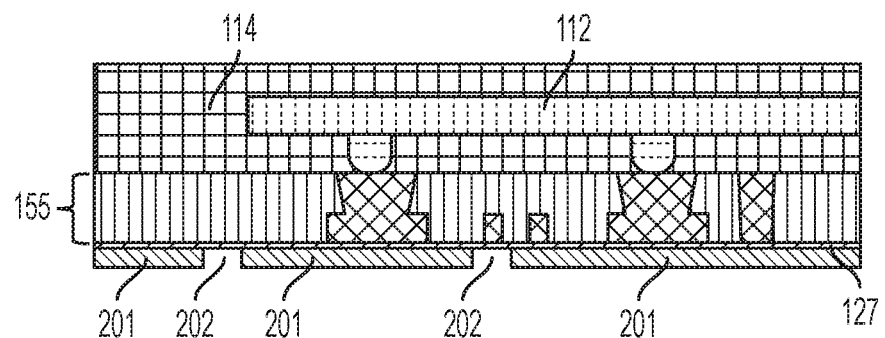
FIG. 23b depicts a side cutaway view of another step of the fabrication process of FIG. 23a in accordance with one embodiment.
Figure 23C:
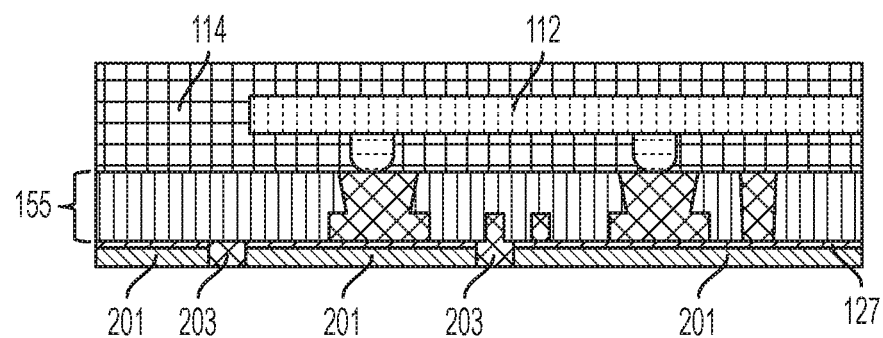
FIG. 23c depicts a side cutaway view of another step of the fabrication process of FIGS. 23a-23b in accordance with one embodiment.
Figure 23D:
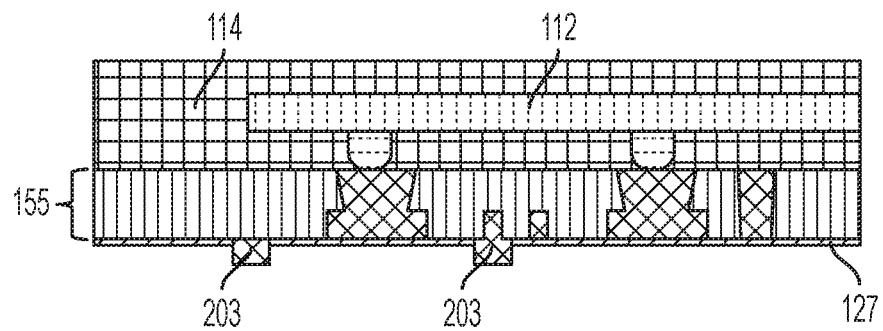
FIG. 23d depicts a side cutaway view of another step of the fabrication process of FIGS. 23a-23c in accordance with one embodiment.

FIGS. 23a, 23b, 23c and 23d show a process for above plane structures applied above the etched layer. FIG. 23a shows a step after the semiconductor die 112 has been encapsulated in the mold 114, after the carrier tape 128 has been removed but prior to the etching. At the step shown in FIG. 23b, a photoresist pattern 201 has been applied adjacent to the thin foil layer 127 with a plurality of photoresist openings 202, prior to etching. Once this pattern has been established, FIG. 23c shows that above place circuits 203 may be plated on the thin foil layer 127. Once this occurs, etching the thin layer 127 may be accomplished to create the above plane circuits 204, as shown in FIG. 23d. Other processes for above plane conductive circuits are contemplated including standard build up layering. For example, once the etched layer with above plane circuits has been applied, another standard build up layer may be applied. Once the encapsulating mold 114 has been applied about the semiconductor die 112 and hardens, the die may act as the structural support upon which to build additional layers in a standard build process.

Figure 24:
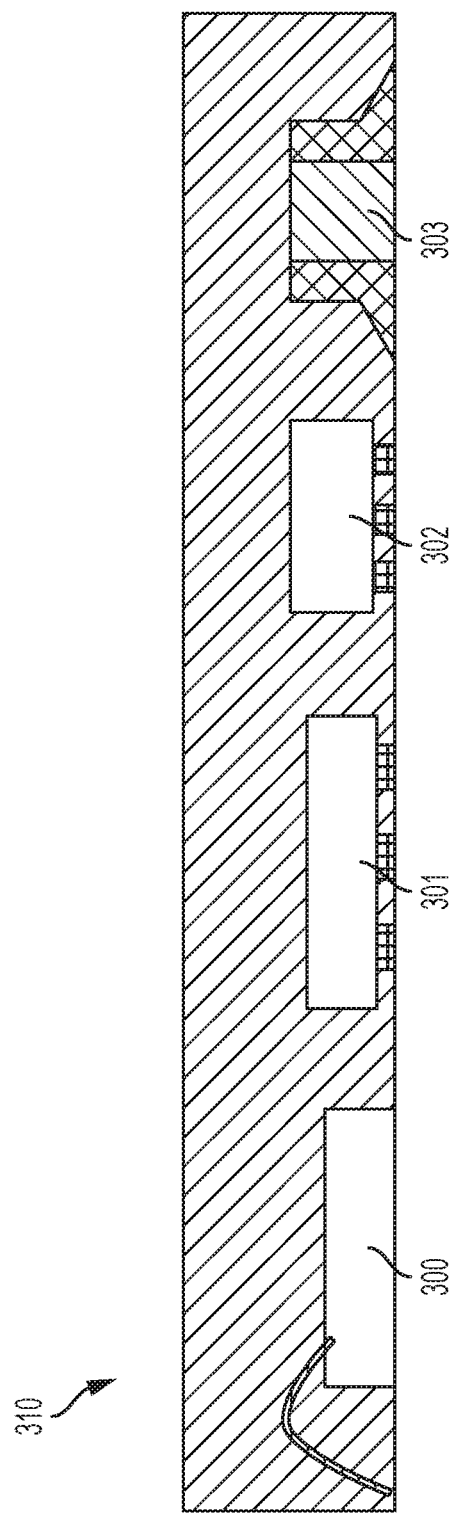
FIG. 24 depicts a side cutaway view of a system in package structure in accordance with one embodiment.

Referring to FIG. 24 package structure(s) with multiple active(s) and/or passive(s) combinations may be redistributed simultaneously. As shown, a wirebond 300, a flipchip 301, an IDP 302 and a passive component 303 are shown packaged together in a system in package (SIP) arrangement 310. This system in package approach as shown in FIG. 24 may be accomplished using the carrier structure 10 as described herein.

Figure 17:
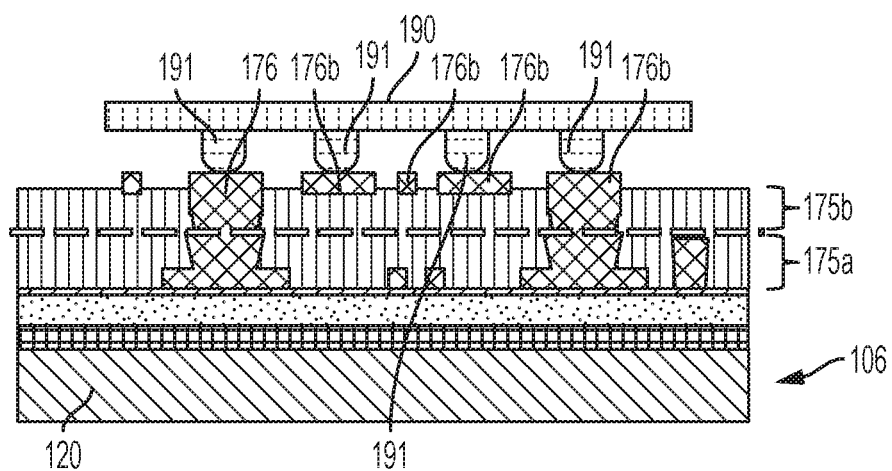
FIG. 17 depicts a side cutaway view of an option for a build-up of layers in a fabrication process according to one embodiment.

Referring now to FIG. 17, another embodiment is illustrated. In this embodiment, multiple RDL layers are formed on an underlying carrier structure 10b, the same or similar to the carrier structures 10, 10a. Here, embedded features may be located proximate to the BGA pads formed on the thin releasable foil of the carrier in a first substrate layer 175a. However, a second substrate layer 175b may be built upon the first substrate layer 175a using a standard build up process which results in at least some above plane conductive elements 176 which may be capture pads for receiving pillars or interconnects 191 of the semiconductor die 190. A dashed line is shown between layers 175a and 175b to highlight the difference in layers. However, it should be understood that this dashed line is imaginary and simply shown to demonstrate that there are two separate layers. Again, the attachment of the semiconductor die 190 may occur when the releasable carrier 120 remains attached before release in this embodiment.

Figure 26:
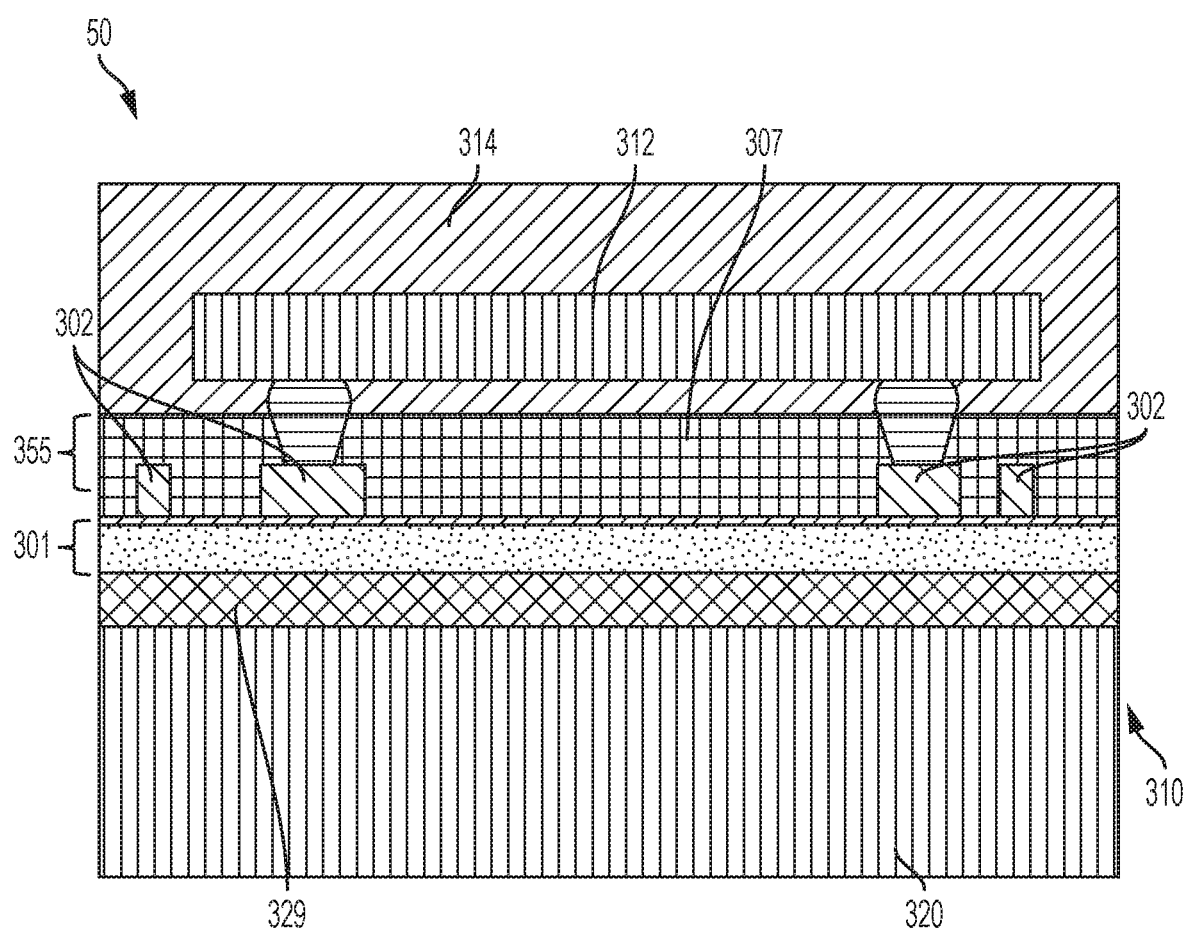
FIG. 26 depicts a double mold layering structure in accordance with one embodiment.

FIG. 26 shows another embodiment of another semiconductor device 50 that is at least partially fabricated in a manner consistent with that described herein above. This semiconductor device 50 includes a conductive circuit 352 and a first layer of insulative material 307 which is a first mold material. A "mold" as described and used herein means a thermoplastic material having a substantial filler content. Additionally, a mold may mean a material having a substantial filler size as well. A mold material is further configured to protect the encapsulated conductive circuits 352. The first mold material 307 may encapsulate the conductive circuit 352 and may be configured to act as an electrical insulator and/or a dielectric. The conductive circuit 352 may be an embedded circuit that may eventually be completed by etching a thin foil layer, as described hereinabove. The first mold material and the encapsulated conductive circuit 352 may comprise a first substrate layer 355. The semiconductor device 50 may further include a semiconductor die 312 encapsulated within a second mold material 314. In other embodiments, the semiconductor die may be encapsulated within the first semiconductor material 307 that has been used to encapsulate the conductive circuit 352.

Consistent with the embodiments described hereinabove, semiconductor device 50 may be fabricated on a carrier structure 310 having a releasable carrier 320, an adhesive layer 329 and a releasable foil layer 301. The substrate 355 may be built upon the releasable carrier, which may include the adhesive layer 329 which may be thermally or UV activated. As shown, the semiconductor die 312 may be encapsulated with the second mold material 314 before the releasable carrier 320 has been removed or released from the substrate 355 and the package structure.

The first mold material 307 and the second mold material 314 may be a thermoplastic mold compound which is able to soften upon heating, and is capable of being hardened upon cooling. This softening and hardening may be repeatable for additional heat applications without compromising the integrity of the eventually hardened compound. This may be particularly advantageous for embodiments in the present invention, which may require additional heat applications for removing the releasable carrier 320, in the case that the adhesive layer 329 is a thermally releasable compound. The first mold material 307 may not be mixed with thermosetting dielectric materials. The first mold compound 307 may function in a similar manner to thermosetting dielectric materials such as ABF film and PID and other dielectric materials, but the first mold compound 307 may actually be a thermoplastic compound. The first mold material 307 layer may also be thinner than the second mold material 314 layer, as the first mold material 307 is configured to function as a prepreg or dielectric encapsulate material.

In one embodiment, the second mold material 314 may be different than the first mold material 307. It may be particularly advantageous in some fabrication processes for the first mold material 307 to have a lesser filler content than the second mold material 314. Similarly, the first mold material 307 may have a filler size that is less than the second mold material 314. By having a greater filler content and filler size than the first mold material 307, the second mold 314 material may prevent warpage and may be particularly advantageous. Having a lower filler content and filler size for the first mold material 307 may be desirable for achieving precise and thin fill dimensions necessary for creating substrate layers.

Overall, this double mold process may allow for packages with redistribution layers to be processed by the sole use of thermoplastic molding compounds and without the use of thermosetting dielectric materials, in one embodiment.

There are benefits of using thermosetting mold compounds for the entire package structure resulting in less mismatch in material properties such as CTE, Tg, and resin rheology. This may allow the material and process adjustment to control warpage and other reliability concerns. The double mold process may be incorporated into current assembly line infrastructures already designed to handle mold compound materials. In the case of a multi-layer package design, the package construction may require a combination of thermosetting and thermoplastic materials. It should further be understood that dielectric substrate layers may be applied below the first substrate layer 355 once the carrier assembly 310 has been removed and the thin foil has been etched in the manner described hereinabove. Thus, the single substrate layer 355 adjacent to the semiconductor die 312 may be made with mold in the manner described herein, but additional layers may be built up in a standard build-up process using dielectric materials.

Another embodiment contemplated is a method of making a semiconductor device that includes providing a substrate, such as the substrate 355, that includes a first mold material, such as the first mold material 307, and a conductive circuit, such as the conductive circuit 352, in the first mold material. The method may include providing a semiconductor die, such as the semiconductor die 312. The method may include attaching the semiconductor die to the conductive circuit and encapsulating the semiconductor die with at least one of the first mold material or a second mold material, such as the second mold material 314. The method may include preventing the mixing of the first mold material with thermosetting dielectric materials. The method may include encapsulating the semiconductor die with the second mold material. The method may include created an embedded the conductive circuit by etching a conductive layer or sheet. The method may further include insulating an entire package structure of a semiconductor device by the sole use of one or more mold compounds. The method may further include providing a thermally activated releasable carrier, such as the releasable carrier 320, building a substrate, such as the substrate 355, upon the thermally activated releasable carrier, attaching the conductive circuit before the thermally activated releasable carrier is removed from the substrate. The method may include exposing the thermally activated releasable carrier to an appropriate temperature, and releasing the thermally activated releasable carrier.

Figure 27:
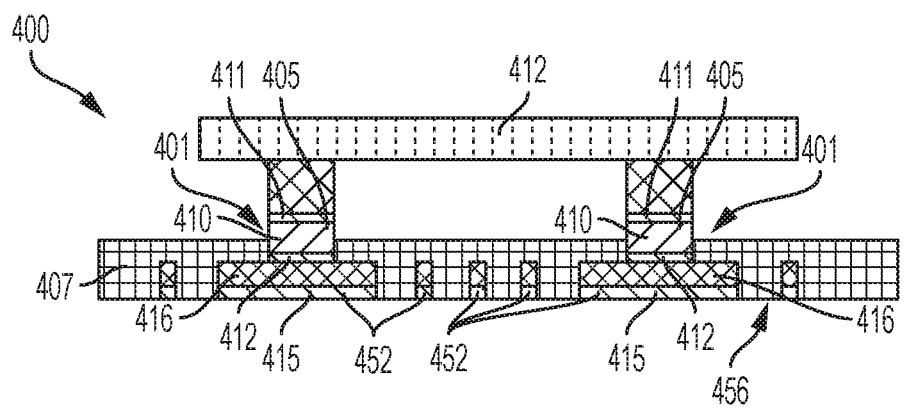
FIG. 27 depicts a interconnect joint layering structure in accordance with one embodiment.

FIG. 27 shows still another embodiment of a semiconductor device 400 having an interconnection joint structure 401. Shown is a semiconductor device 400 having a semiconductor die 412 at a stage in a fabrication process prior to encapsulation of the semiconductor die 412 with a mold. The package shown may be resting on a carrier structure (not shown) in a manner consistent with the embodiments of the carrier structures described herein above. Thus, a thin foil layer (not shown) may rest below a substrate 455 shown. The substrate 455 may include a conductive circuit 452 and an insulative material 407. The substrate 455 may further include a first surface 456 that is adjacent to the conductive layer or other base and a second surface 457 that is proximate or facing the semiconductor die 412. The semiconductor die 412 is shown attached to the substrate above or proximate the second adjacent to the second surface 457.

The semiconductor device 400 may include the interconnect joint structure 401 in the substrate 455 creating a capture pad 405. The interconnect joint structure 401 may include a copper layer 410 and an adjacent top nickel layer 411 and an adjacent bottom nickel layer 412. Thus, the interconnect joint structure 401 may define a capture pad 405 which includes the first nickel layer 411 followed by the copper layer 410 and the second nickel layer 412. This interconnect joint structure 401 may be found in a single layer of the insulative material 407 or a single applied layer of the substrate 455. The semiconductor die 412 may be attached to the substrate 455 in this manner without a via. In one embodiment, the substrate 455 and the interconnect joint structure 401 may be formed using a build-up process. In another embodiment, a subtractive process may be utilized (i.e. with laser ablation of the insulative material, for example). While the layers 411, 412 have been described as nickel, other embodiments are contemplated where the layers 411, 412 are made of other metals, such as zink or other plating metals.

The nickel layers 411, 412 may be plated layers that are particularly configured to protect during solder or pillar attachment of the semiconductor die 412 when very thin insulative encapsulation layers are necessary. For example, if the insulative layer 407 is very thin (i.e. below 12 µm thick), the insulative layer 407 (e.g. dielectric, PID or ABF film) may act as a soldermask defined (SMD) for the pad opening. The nickel layers 411, 412 may provide a barrier to prevent copper consumption by solder (Sn—Pb) during joint intermetallic formation using pillars 420 and solder balls (as shown in FIG. 28).

An additional nickel layer 415 may be provided adjacent to the first surface 456. This nickel layer 415 may function as an etch stop barrier during thin foil etching from a carrier structure as described hereinabove. A copper layer 416 may be provided above the nickel layer 415. The nickel layer 415 may control the integrity of fine line circuits (e.g. 2 µm) of the conductive circuit 452 from over etching and poor etching tolerances. Other suitable plating materials are also contemplated other than nickel to provide a barrier, such as zinc.

Figure 28:
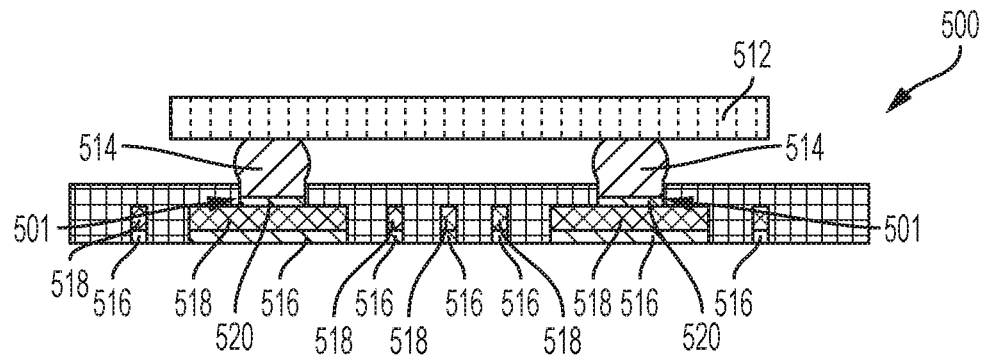
FIG. 28 depicts another interconnect joint layering structure in accordance with one embodiment.

Referring now to FIG. 28, an embodiment is shown similar to the embodiment shown in FIG. 27. Here, a semiconductor device 500 is shown having a semiconductor die 512 with solder balls 514. This embodiment shows an interconnect joint structure 501 that may be applicable to instances when the semiconductor die 512 includes the solder balls 514 instead of the copper pillar 420, and where the insulator acts as a soldermask defined. In this embodiment, a single layering process including a first nickel layer 516 followed by a copper layer 518 and another nickel layer 520 are shown to create the interconnect 501. Further, the first nickel layer 516 may be applied to all of the conductive elements to act as an etch barrier, as shown.

Another embodiment includes a method for making a semiconductor device that includes providing a substrate, such as the substrate 455, and an insulative layer, such as the insulative layer 107 over the conductive circuit. The method may include forming a capture pad, such as the capture pad 405, in the substrate including a first layer of nickel, such as the first nickel layer 411, a layer of copper over the first nickel layer, such as the layer of copper 412, and a second layer of nickel over the layer of copper, such as the second layer of nickel 411. The method may include etching a layer of copper foil, such as the thin foil on a surface of the substrate. The method may include including the first layer of nickel, the layer of copper, and the second layer of nickel within a single layer of the insulator. The method may include providing a semiconductor die, such as the semiconductor die 512, and attaching the semiconductor die to at least a portion of the conductive circuit without a via. The method may include providing a nickel layer, such as the nickel layer 415, in the substrate to act as an etch stop barrier between the etched foil layer and the conductive circuit. The method may include the semiconductor die including solder balls, such as the solder balls 514, and attaching the solder balls to at least one of the first and second layers of nickel.

Referring back to FIGS. 27 and 28, another embodiment is contemplated whereby the layers 416, 418 and 516, 518 may have a bi-metal structure. In one case, the bi-metal structure may be a copper and nickel structure. In one embodiment, the metals may be joined together through heat. The metals may each have different coefficients of thermal expansion in one embodiment. Further, the layers 416, 418 and 516, 518 may allow for the plating of ultra-fine nickel barriers (i.e. less than or equal to 3 µm) plated onto the copper foil. These ultra-fine levels may create patterned circuit lines that are less than 3 µm, for example 2 µm, or as little as 1 µm or less. The nickel structure 416, 516 may provide for this ultra-thin plating.

Figure 31:
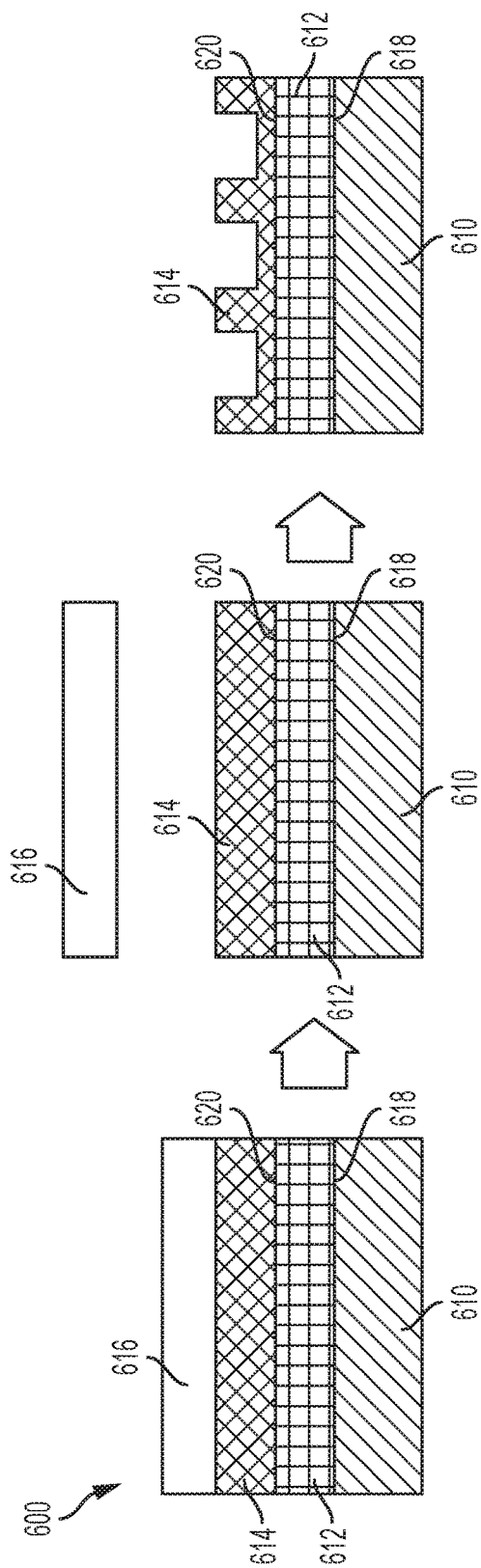
FIG. 31 depicts an embodiment of a multiple step release process for a releasable carrier in accordance with one embodiment.

FIG. 31 depicts an embodiment of a multiple step release process for creating a releasable carrier structure 600 in accordance with one embodiment. In this embodiment, a carrier layer 610 is shown. The carrier layer 610 may be a glass carrier, in one embodiment. Other examples are contemplated, as described above. A releasable tape layer 612 is shown attached to the carrier layer 610 in a layer above the carrier layer 610. In one embodiment, the releasable tape layer 612 may be REVALPHA tape or the like. A copper layer 614 is shown attached to the releasable tape layer 612 in a layer above the releasable tape layer 612. An aluminum layer 616 is shown attached to the copper layer 614 in a layer above the copper layer 614. Thus, a four layer structure is shown having the layers 610, 612, 614, 616. In this embodiment, two release points are contemplated: a first release point 618 between the glass layer 610 and the releasable tape layer 612, and a second release point 620 between the releasable tape layer 612 and the copper layer 614.

In this embodiment, the copper layer 614 and the aluminum layer 616 may be a copper layer bonded on an aluminum carrier held by an adhesive, such as an organic adhesive. In another embodiment, the copper layer 614 may be welded along the edges through ultrasonic welding to the aluminum layer 616. In both the cases of bonding with an adhesive and welding around the edges, the aluminum layer 616 may be released from the copper layer 614, as shown, by cutting the material inside the adhesive or welded area. Inside this adhesive or welded area, the copper layer 614 may not be adhered or welded to the aluminum layer 616.

Thus, in this embodiment, the copper layer 614 is attached to the to the releasable tape layer 612, which may be also adhered or attached to the carrier layer 610. The edges of the aluminum layer 616 may remain adhered or welded to the copper layer 614 but the remainder of the aluminum layer 616 may not be adhered or attached to the copper layer 614. Once the edges are cut away, the aluminum layer 616 separates freely from the copper layer 614, as shown in the second step. In the third step, the copper layer 614 may be etched to create a circuit. From there, later steps (not shown) may include building up layer(s) on the copper layer 614 and bonding a chip to the built copper layer(s) 614. Once the chip construction is complete, activation may occur to release the carrier layer 610 and the releasable tape layer 612 at the release points 620, 618, respectively. In this manner, only two activated release points 620, 618 are contemplated.

Figure 32:
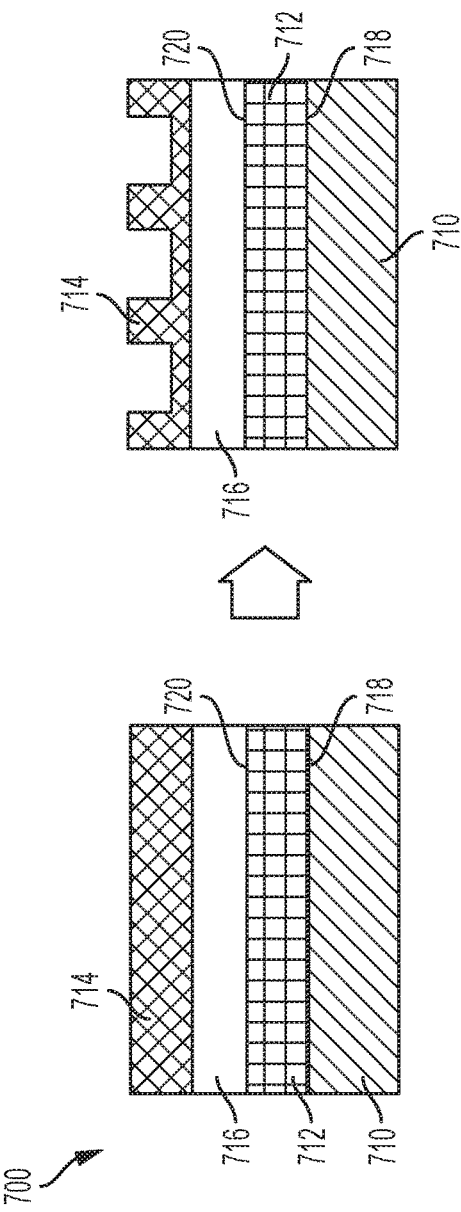
FIG. 32 depicts another embodiment of a multiple step release process for a releasable carrier in accordance with one embodiment.

FIG. 32 depicts another embodiment of a multiple step process for creating a releasable carrier structure 700 in accordance with one embodiment. In this embodiment, a carrier layer 710 is shown. The carrier layer 710 may be a glass carrier, in one embodiment. Other examples are contemplated, as described above. A releasable tape layer 712 is shown attached to the carrier layer 710 in a layer above the carrier layer 710. In one embodiment, the releasable tape layer 712 may be REVALPHA tape or the like. In this embodiment, an aluminum layer 716 is shown attached to the releasable tape layer 712 in a layer above the releasable tape layer 712. A copper layer 714 is shown attached to the aluminum layer 716 in a layer above the aluminum layer 716. Thus, a four layer structure is shown having the layers 710, 712, 716, 714. In this embodiment, two release points are contemplated: a first release point 718 between the glass layer 710 and the releasable tape layer 712, and a second release point 720 between the releasable tape layer 712 and the aluminum layer 716.

In this embodiment, the aluminum layer 716 is attached to the to the releasable tape layer 712, which may be also adhered or attached to the carrier layer 710. In a second step, the copper layer 714 may be etched to create a circuit. From there, later steps (not shown) may include building up layer(s) on the copper layer 714 and bonding a chip to the built copper layer(s) 714. Once the chip construction is complete, activation may occur to release the carrier layer 710 and the releasable tape layer 712 at the release points 720, 718, respectively. In this manner, only two activated release points 720, 718 are contemplated. Once the chip construction is complete and the carrier layer 710 and releasable tape layer 712 are removed, the aluminum layer 716 may be exposed. From here, the aluminum layer 716 may be removed by preferential etching whereby the aluminum layer 716 is removed without effecting the copper layer 714. This removal of the aluminum layer 716 may require one, two, or more chemicals.

Figure 33:
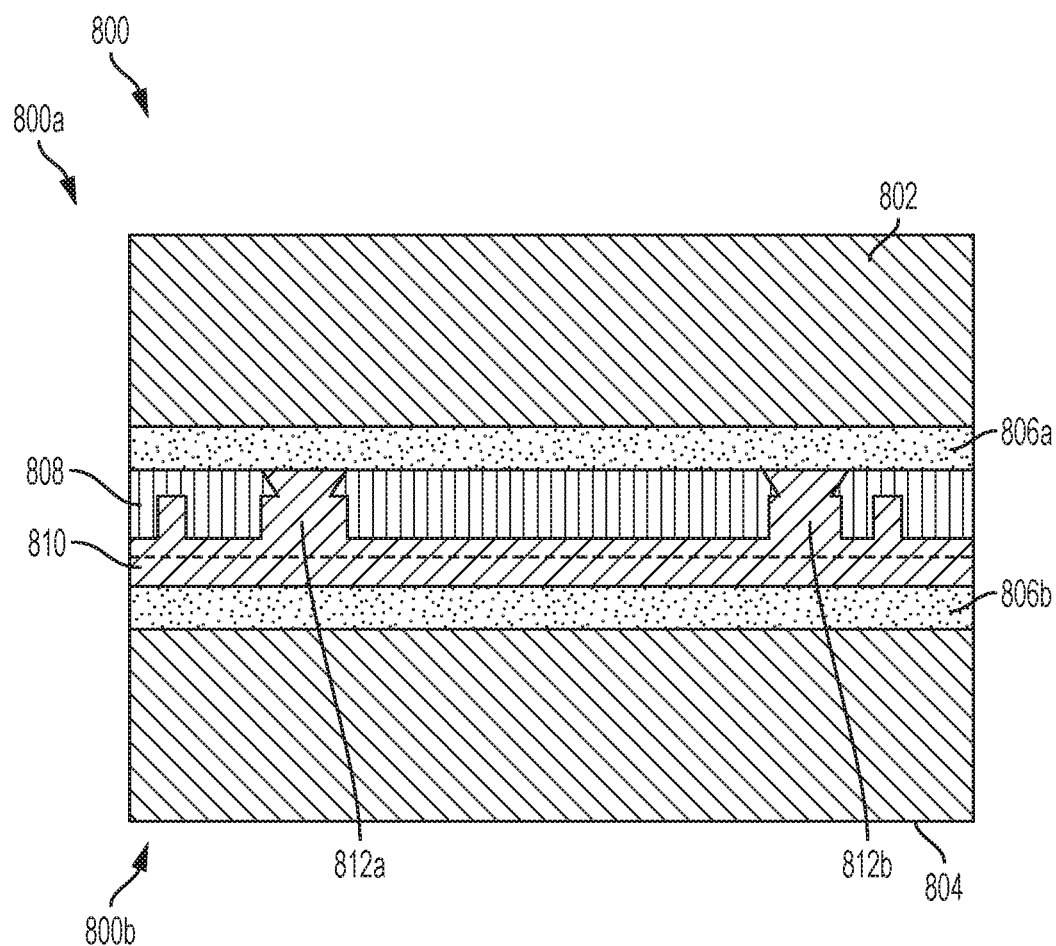
FIG. 33 depicts an alternative embodiment of a carrier structure whereby multiple semiconductor carriers are used, in accordance with one embodiment.
Figure 34A:
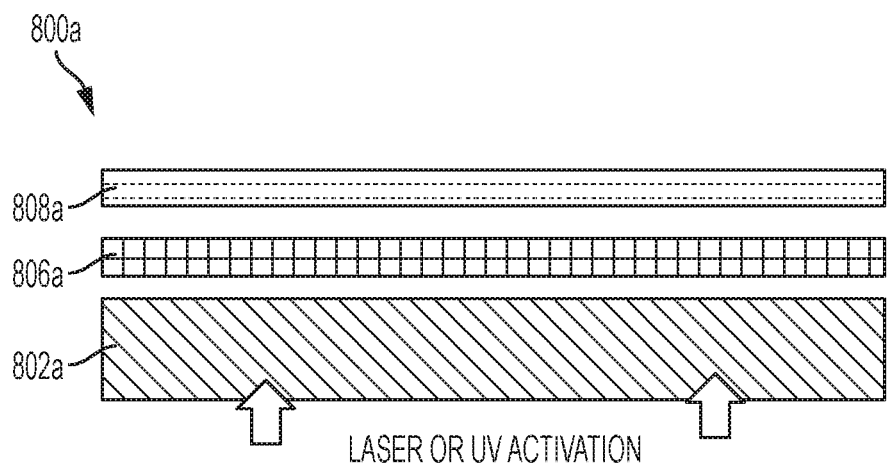
FIG. 34a illustrates a first alternative embodiment for the first portion of the carrier structure of FIG. 33, in accordance with one embodiment.
Figure 34B:
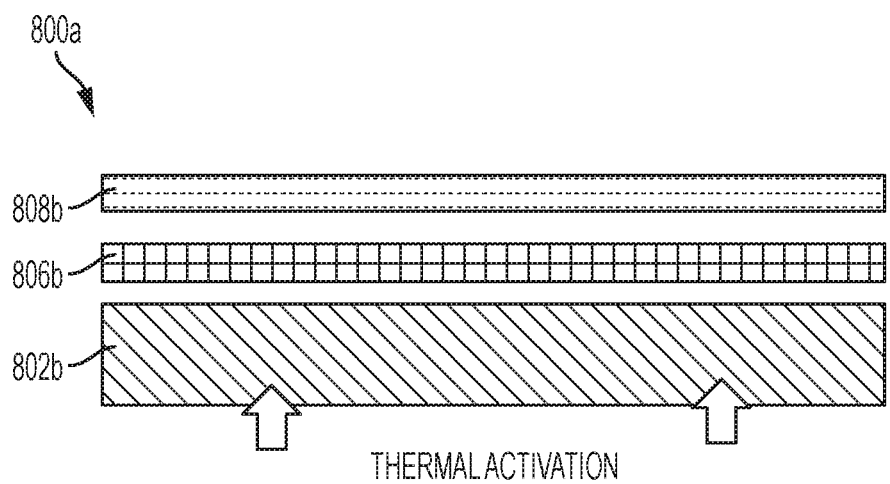
FIG. 34b illustrates a second alternative embodiment for the first portion of the carrier structure of FIG. 33 in accordance with one embodiment.

Referring now to FIG. 33, an alternative embodiment of a carrier structure 800 is illustrated whereby multiple semiconductor carriers (i.e., carrier 802 and carrier 804) are used, in accordance with embodiments of the present invention. Carrier structure 800 includes a first portion 800a including a carrier 802 and a releasable tape or adhesive layer 806a attached to a dielectric layer 808 (e.g., a mold sheet layer, ABF spin on films layer, etc.) formed as an encapsulation layer surrounding formed circuit structures 812a . . . 812n formed from a releasable copper foil layer 810. Additionally, carrier structure 800 includes a second portion 800b including a carrier 804, a releasable tape layer 806b, and a releasable copper foil layer 810. Carrier 804 comprises a base carrier for providing a backing structure for use during a redistribution layer (RDL) process. Carrier 802 is removed from carrier structure 800 before carrier 804 is attached to carrier structure 800. Carrier 804 may be removed from carrier structure 800 via a laser/UV release process, a thermal release process, etc after a redistribution layer (RDL) and a circuit layer has been completed. Carrier 802 provides a backing structure for use during an assembly process. Additionally, carrier 802 provides a backing structure for enabling an electrical testing procedure. Carrier 804 may include, among other things, a glass carrier. Carrier 804 may be removed from carrier structure 800 after an additional carrier (e.g., carrier 802c as described with respect to FIG. 35b, infra) is attached to carrier structure 800 as described with respect to FIGS. 35b and 36a-36m, infra. Carrier 804 may be removed from carrier structure 800 via a laser/UV release process, a thermal release process, etc. Carrier structure 802 and carrier structure 804 may be removed or separated from carrier structure 800 via laser activation, UV activation, and/or thermal activation. A third carrier structure (e.g., carrier structure 922 as illustrated in FIG. 36J, infra) may be released via a UV or laser activation process due to usage of a glass carrier material. Carrier structure 804 comprises a panel format (P). Carrier structure 802 may comprise a strip format (S) or a panel format (P). A third carrier structure may comprise a strip format (S) or a panel format (P). Therefore, the entire semiconductor structure comprising all three carrier structures (carrier structure 802, carrier structure 804, and the third carrier structure) may respectively be formed as: (1) PPP (panel to panel to panel), (2) PSS (panel to strip to strip), or (3) PSP (panel to strip to panel). With respect to embodiments associated with the PSS option and the PSP option, an RDL circuit associated with a panel format on a first carrier structure must be singulated via a laser process into strip size in order to match a carrier structure (i.e., carrier structure and a releasable adhesive) in strip format. An alternative embodiment that includes an all panel format (PPP) is associated with an RDL circuit on a panel that does not require execution of a laser singulation process (i.e., an all panel processing format). The aforementioned embodiments apply to FIGS. 36a-36m as described, infra. A laser ablation/singulation technique as illustrated with respect to FIG. 37, infra may be used for singulation with respect to the carrier structure from panel to strip format (i.e., after FIG. 36c), instead of a panel to unit singulation process. The additional carrier enables a laser singulation process to be performed to convert a panel size to a unit size with respect to the additional carrier. Releasable tape layer 806a and 806b may each alternatively include an adhesive layer. Additionally, the first carrier structure (as illustrated in FIGS. 34A and 34B) includes a copper layer, a releasable adhesive layer, and a backing carrier structure (i.e., glass or stainless steel). The second and third carrier structures include releasable adhesive and a backing carrier structure as illustrated in FIG. 35.

FIG. 34a illustrates a first alternative embodiment for the first portion 800a of the carrier structure 800 of FIG. 33, in accordance with embodiments of the present invention. The first portion 800a (illustrated in FIG. 34a) includes a glass carrier 802a attached to a conductive copper releasable (or non-releasable) foil layer 808a via a releasable (via thermal, UV, or laser releasable activation) adhesive layer 806a. Glass carrier 802a comprises a panel format used for circuit build up purposes as illustrated with respect to FIGS. 18 and 19, supra.

FIG. 34b illustrates a second alternative embodiment for the first portion 800a of the carrier structure 800 of FIG. 33, in accordance with embodiments of the present invention. The first portion 800a (illustrated in FIG. 34a) includes a metal core carrier 802b attached to a conductive copper releasable foil layer 808b via a releasable (via thermal activation) adhesive layer 806b.

Figure 35A:
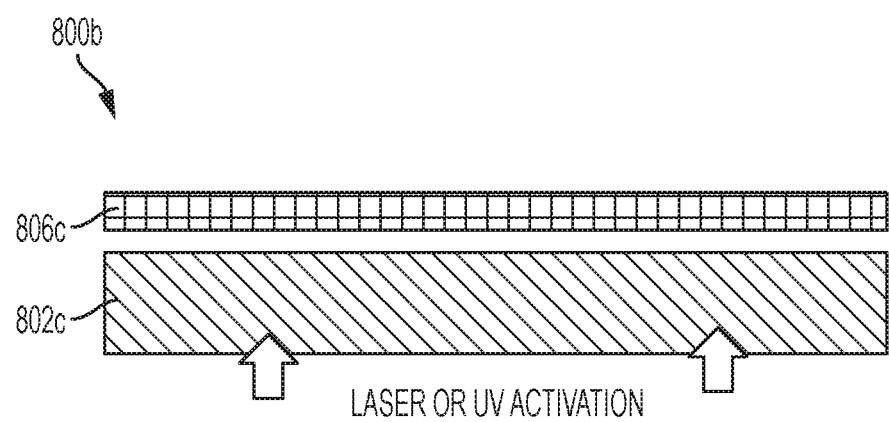
FIG. 35a illustrates an alternative embodiment for the second portion of the carrier structure of FIG. 33 in accordance with one embodiment.
Figure 35B:
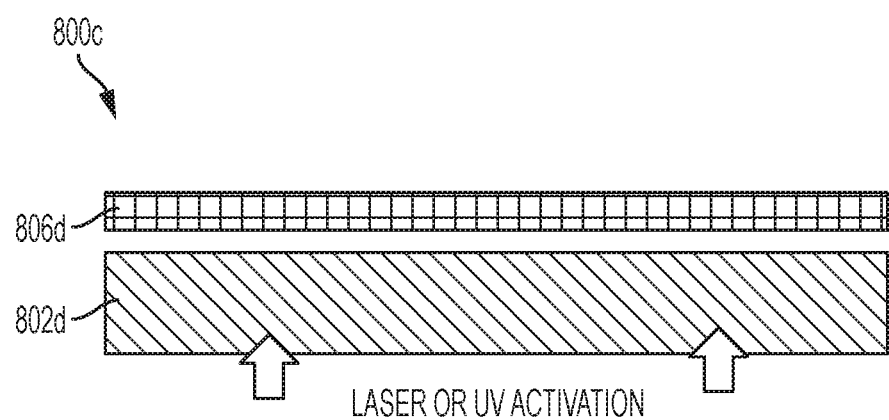
FIG. 35b illustrates an alternative embodiment for the additional carrier 800c of the carrier structure 800 of FIG. 33 in accordance with one embodiment.

FIG. 35a illustrates an alternative embodiment for the second portion 800b of the carrier structure 800 of FIG. 33, in accordance with embodiments of the present invention. The second portion 800b (illustrated in FIG. 35a) includes a glass carrier 802c attached to a releasable (via UV activation) adhesive layer 806c. carrier test FIG. 35b illustrates an alternative embodiment for the additional carrier 800c of the carrier structure 800 of FIG. 33, in accordance with embodiments of the present invention. The additional carrier 800c (illustrated in FIG. 35b) includes a glass carrier 802d attached to a releasable (via UV activation) adhesive layer 806d.

FIGS. 36a-36m illustrate a fabrication process for the creation or fabrication of carrier structure 800 of FIG. 33, in accordance with embodiments of the present invention.

Figure 36A:
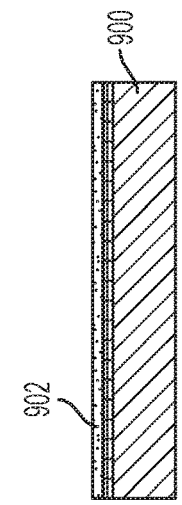
FIGS. 36a-36m illustrate a fabrication process for the creation or fabrication of the carrier structure of FIG. 33 in accordance with one embodiment.

FIG. 36a illustrates a step of providing a releasable chip carrier 900 that is attached to a conductive layer(s) 902 to create a carrier structure.

Figure 36B:
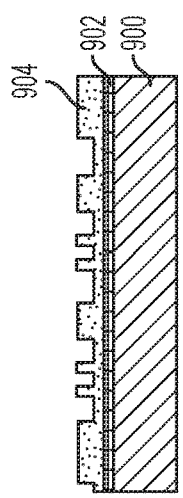

FIG. 36b illustrates a step of forming a circuit layer 904 on a surface of the conductive layer(s) 902 to create a carrier structure.

Figure 36C:
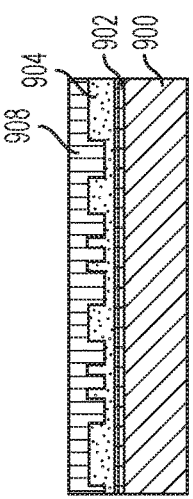

FIG. 36c illustrates a step of forming a dielectric layer 908 on a surface of the circuit layer 904 to create a carrier structure.

Figure 36D:
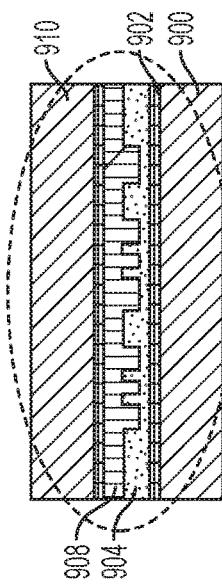

FIG. 36d illustrates a step of attaching a releasable chip carrier 910 to a surface of the dielectric layer 908 to create a carrier structure as illustrated with respect to FIG. 33. Releasable chip carrier 900 and releasable chip carrier 910 may each include a panel size format, a strip size format, etc.

Figure 36E:
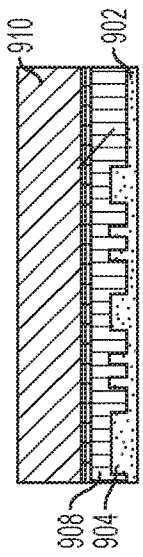

FIG. 36e illustrates a step of releasing releasable chip carrier 900 from the conductive layer 902 via facilitation of an activating source. The activating source may include any type of activating source including, inter alia, a UV light activating source, a thermal activating source, any type of laser releasing activating source, etc.

Figure 36F:
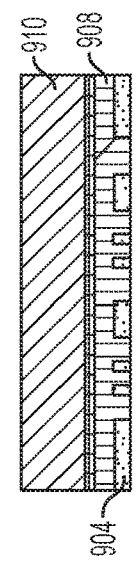

FIG. 36f illustrates a step of etching the conductive layer(s) 902 for removing at least a portion of the conductive layer(s) 902 from the circuit layer 904.

Figure 36G:
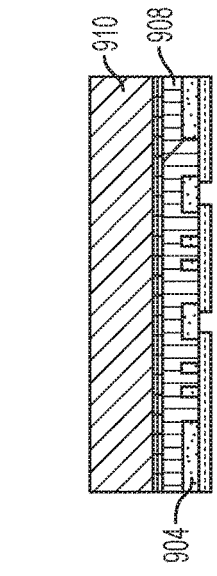

FIG. 36g illustrates a step of operationally testing circuitry of the circuit layer 904. Operationally testing the circuitry may include testing the circuitry for any malfunctions, etc.

Figure 36H:
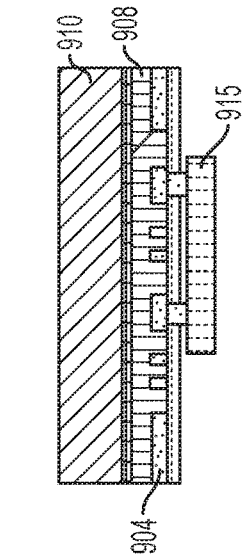

FIG. 36h illustrates a step for attaching a semiconductor die 915 to portions of the circuit layer 904.

Figure 36I:
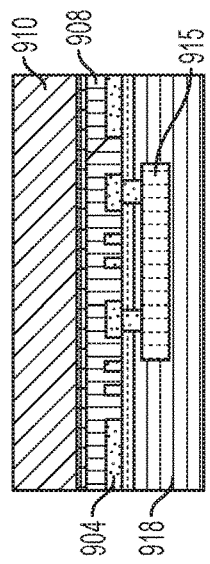
Figure 36J:
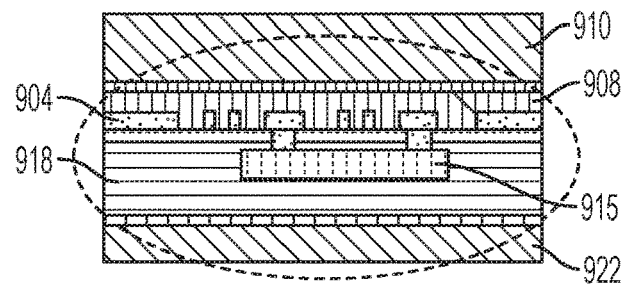

FIG. 36i illustrates a step for forming an encapsulating layer 918 surround the semiconductor die 915.

FIG. 36j illustrates a step of attaching a releasable chip carrier 922 to a surface of the encapsulating layer.

Figure 36K:
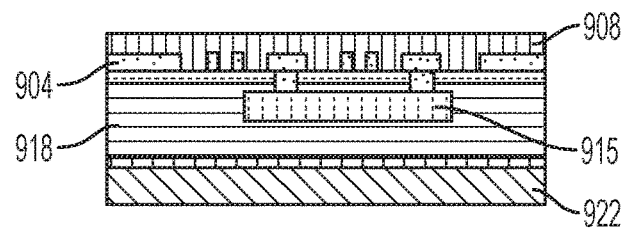

FIG. 36k illustrates a step of releasing releasable chip carrier 910 from the surface of the dielectric layer 908 via facilitation of an activating source. The activating source may include any type of activating including, inter alia, a UV light activating source, a thermal activating source, etc.

Figure 36L:
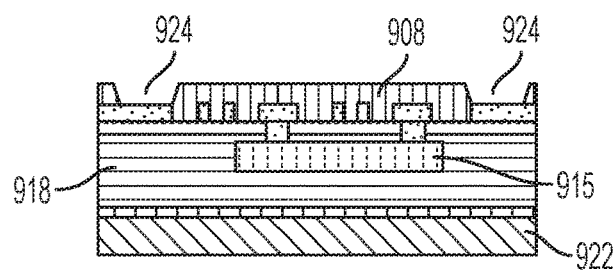

FIG. 36l illustrates a step of removing portions of the dielectric layer 908 thereby forming openings 924 within the dielectric layer.

Figure 36M:
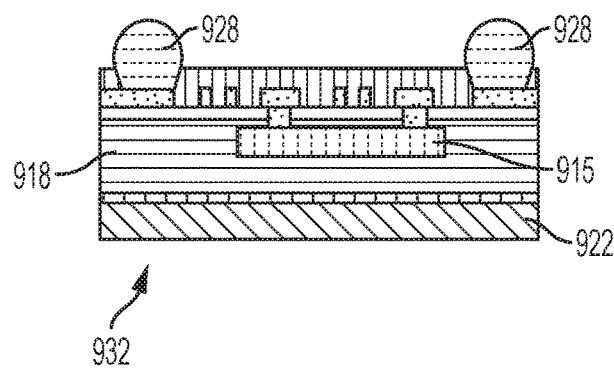

FIG. 36m illustrates a step of forming ball grid array structures within the openings 924. The ball grid array structures 928 are electrically connected to the semiconductor die 915. FIG. 36m illustrates a complete semiconductor package 932.

Figure 37A:
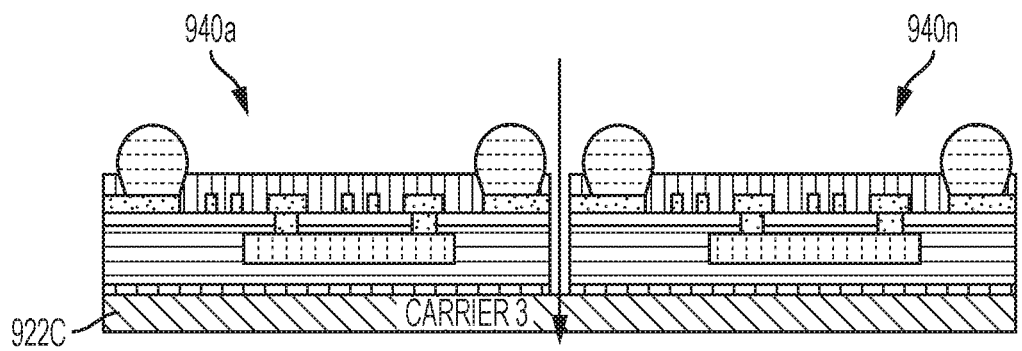
FIGS. 37a-37c illustrate a laser singulation process for generating multiple semiconductor packages in accordance with one embodiment.
Figure 37B:
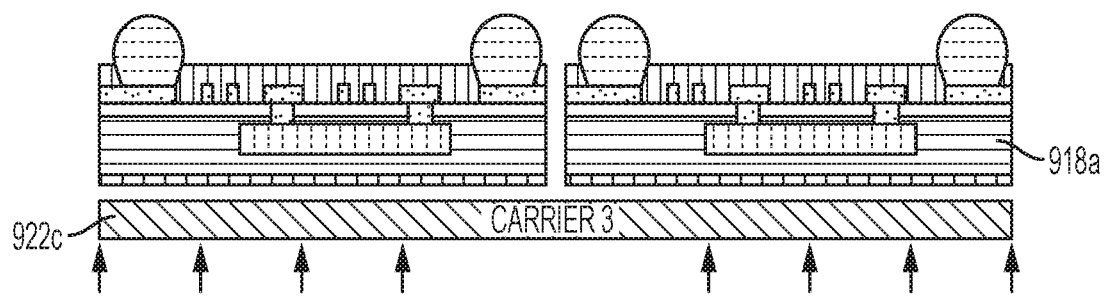
Figure 37C:
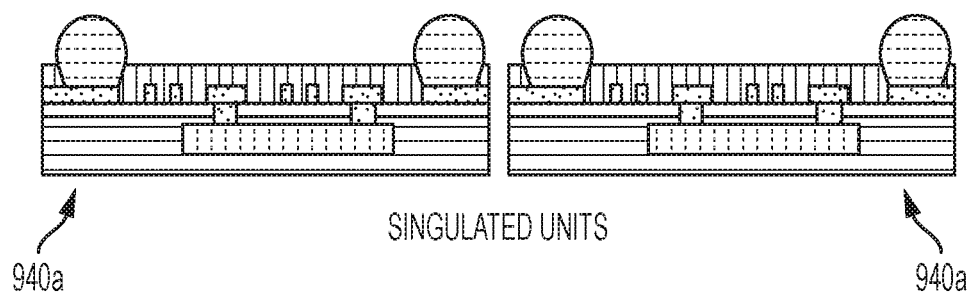

FIGS. 37a-37c illustrate a laser singulation process for generating multiple semiconductor packages 940a . . . 940n, in accordance with embodiments of the present invention. Each of the semiconductor packages 940a . . . 940n generated in combination (on large releasable chip carriers for forming multiple semiconductor packages) as described with respect to the steps illustrated in FIGS. 36a-36m.

FIG. 37a illustrates the step (performed after step described with respect to FIG. 36M) of applying a laser cut through all semiconductor package layers between semiconductor package 940a and 940n and through releasable chip carrier 922. Alternatively, the laser cut process may be performed after the step described with respect to FIG. 36C due to conversion from panel format to strip format with respect to carrier 900.

FIG. 37b illustrates the step of releasing releasable chip carrier 922 from a surface of an encapsulating layer 918a thereby forming the singulated semiconductor packages 940a . . . 940n of FIG. 37c.

Figure 38:
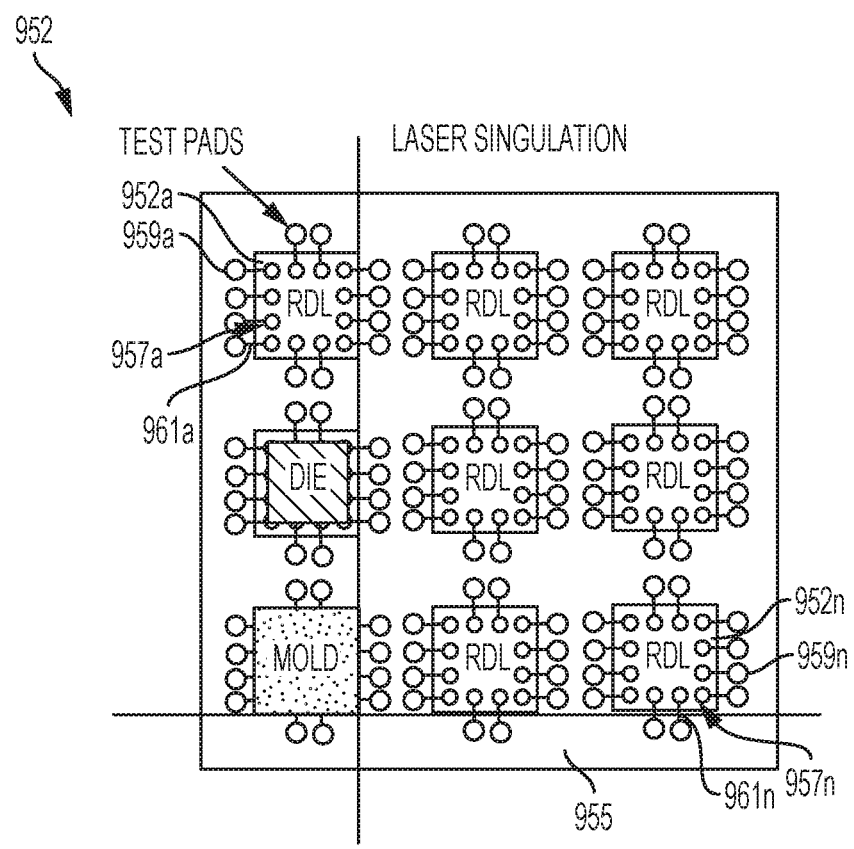
FIG. 38 illustrates the operational test step of FIG. 36g in accordance with one embodiment.

FIG. 38 illustrates the operational test step of FIG. 36g, in accordance with embodiments of the present invention. FIG. 38 illustrates a semiconductor package structure 952 comprising a plurality of semiconductor packages 952a . . . 952n on a single releasable chip carrier 955 prior to performing a laser singulation process for dividing each of semiconductor packages 952a . . . 952n from each other. Semiconductor package structure 952 is enabled for performing a redistribution layer (RDL) test and an automated optical inspection (AOI) process with respect to each of semiconductor packages 952a . . . 952n. The operational testing process may be executed as follows: a single layer is patterned on a first RDL layer and in response, a complete RDL test is executed prior to attaching a semiconductor die to the structure. Additionally, test pads 959a . . . 959n are generated and connected to each BGA 957a . . . 957n and a laser ablation process is performed for exposing the test pads 959a . . . 959n. Upon completion of the testing process, a singulation process is executed for removing all test lines 961a . . . 961n and test pads 959a . . . 959n.

Figure 39:
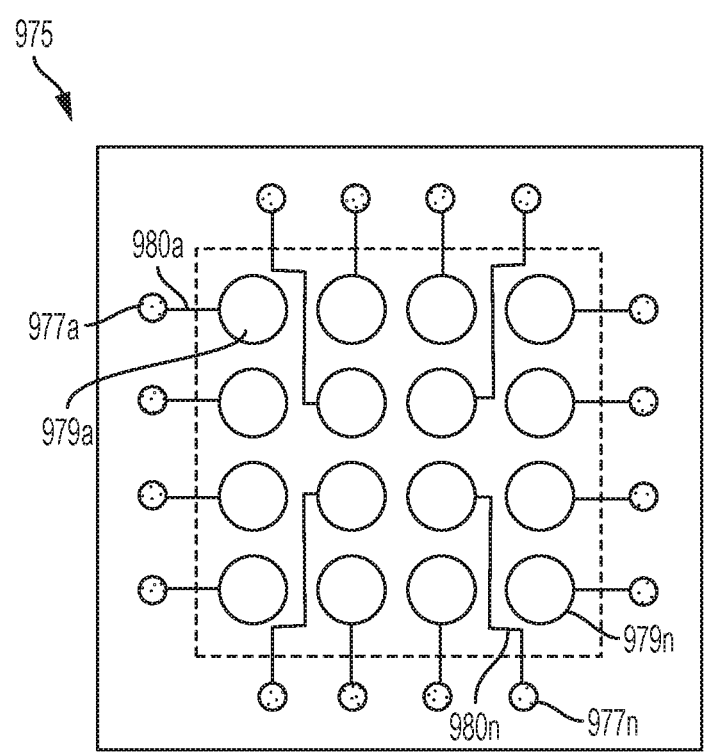
FIG. 39 illustrates an alternative test step with respect to the process of FIG. 38 in accordance with one embodiment.

FIG. 39 illustrates an alternative test step with respect to the process of FIG. 38, in accordance with embodiments of the present invention. FIG. 39 illustrates a semiconductor package structure 975 comprising test pads 977a . . . 977n connected to BGA pads 977a . . . 977n via traces 980a . . . 980n. A laser ablation process is executed for exposing test pads 977a . . . 977n. Test pads 977a . . . 977n are configured to connect BGA pads 977a . . . 977n to signal circuits for executing a complete closed loop test associated with all electrical circuitry. Test pads 977a . . . 977n and traces 980a . . . 980n are removed after all semiconductor packages are singulated into independent semiconductor packages.

FIG. 40a illustrates a first flow diagram 1000 associated with a carrier structure panel to panel to panel (PPP) format, in accordance with embodiments of the present invention. The first flow diagram 1000 includes a first carrier structure 1010a in panel format, a second carrier structure 1020a in panel format, and a third carrier structure 1030a in panel format.

FIG. 40B illustrates a second flow diagram 1002 associated with a carrier structure panel to strip to strip (PSS) format, in accordance with embodiments of the present invention. The first flow diagram 1002 includes a first carrier structure 1010b in panel format, a second carrier structure 1020b in strip format, and a third carrier structure 1030b in strip format.

FIG. 40C illustrates a third flow diagram 1003 associated with a carrier structure panel to strip to panel (PSP) format, in accordance with embodiments of the present invention. The third flow diagram 1003 includes a first carrier structure 1010c in panel format, a second carrier structure 1020c in strip format, and a third carrier structure 1030c in panel format.

FIGS. 41A and 41B illustrate an embodiment of a second releasable chip 1110 carrier in accordance with one embodiment. The second releasable chip carrier 1110 retains a substrate after the substrate is processed and released from a first panel releasable chip carrier. The second releasable chip carrier 1110 may comprise a strip or panel format. Additionally, the second releasable chip carrier 1110 is configured to retain a thin substrate for electrical/AOI testing prior to assembly. A carrier design structure for the second releasable chip carrier 1110 includes a top plate 1110a and a bottom window plate/frame 1110b that may be attached to or detached from each other by means of slots 1258a and 1258n and a screw mechanism 1271a and 1271n. Additionally, a seal/gasket 1123 is placed on top plate 1110a surrounding metal slabs 1139a and 1139b (comprised by top plate 1110a) and windows 1141a and 1141b to prevent fluids from penetrating windows 1141a and 1141b during a wet processing process. When a substrate is released from a first releasable chip carrier onto the second releasable chip carrier 1110, the transferred substrate is attached to the bottom window frame (i.e., windows 1141a and 1141b). An etching process is required to remove thin copper foil used for making a circuit RDL on the first releasable chip carrier. The seal/gasket 1123 prevents any chemicals from wetting the substrate. After the etching process has concluded, top plate 1110a may be removed to expose the substrate in the windows 1141a and 1141b for electrical testing. Therefore, a two plate design (i.e., top plate 1110a and bottom window plate/frame 1110b) for the second releasable chip carrier 1110 provides support and maintains flatness for a thin substrate during an etching process and subsequent electrical test. FIG. 41A illustrates a top view second releasable chip carrier 1110. FIG. 41B illustrates a side view second releasable chip carrier 1110.

Elements of the embodiments have been introduced with either the articles "a" or "an." The articles are intended to mean that there are one or more of the elements. The terms "including" and "having" and their derivatives are intended to be inclusive such that there may be additional elements other than the elements listed. The conjunction "or" when used with a list of at least two terms is intended to mean any term or combination of terms. The terms "first" and "second" are used to distinguish elements and are not used to denote a particular order.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

I claim:

1. A method for forming a semiconductor package comprising:
   providing a first releasable chip carrier attached to a conductive layer;
   forming a circuit layer on a surface of the conductive layer;
   applying a dielectric layer over a surface of the circuit layer;
   attaching a second releasable chip carrier to a surface of the dielectric layer;
   releasing, by a first activating source, the first releasable chip carrier from the conductive layer; and
   operationally testing circuitry of the circuit layer.

2. The method of claim 1, wherein results of said operationally testing indicate that the circuitry is operationally functional, and wherein said method further comprises:
   attaching a semiconductor die to portions of the circuit layer;
   forming an encapsulating layer surrounding the semiconductor die;
   attaching a third releasable chip carrier to a surface of the encapsulating layer; and
   releasing, by a second activating source, the second releasable chip carrier from the surface of the dielectric layer.

3. The method of claim 2, wherein the first releasable chip carrier, the second releasable chip carrier, and the third releasable chip carrier each comprise a size format selected from the group consisting of a panel size format and a strip size format.

4. The method of claim 2, further comprising:
   removing portions of said dielectric layer thereby forming openings within the dielectric layer; and
   forming ball grid array structures within the openings, wherein the ball grid array structures are electrically connected to the semiconductor die, and wherein the conductive layer, the circuit layer, the dielectric layer, the semiconductor die, the encapsulating layer, and the ball grid array structures form the semiconductor package.

5. The method of claim 2, wherein the second activating source comprises a same activating source as the first activating source.

6. The method of claim 2, wherein the second activating source differs from the first activating source.

7. The method of claim 1, wherein the first releasable chip carrier and the second releasable chip carrier each comprise a panel size format.

8. The method of claim 1, wherein the first releasable chip carrier comprises a panel size format, and wherein the second releasable chip carrier comprises a strip size format.

9. The method of claim 1, wherein the first activating source does not make physical contact with the first releasable chip carrier.

10. The method of claim 1, wherein the applying a dielectric layer over a surface of the circuit layer comprises sequentially applying multiple dielectric layers over the surface of the circuit layer.

11. The method of claim 1, wherein the first activating source is a heat source, and wherein the method includes raising the temperature of an adhesive located between the first releasable chip carrier and the conductive layer to a temperature between 150° C. and 300° C.

12. The method of claim 1, wherein the conductive layer includes a thin foil layer and a carrier foil layer, and wherein the releasing the first releasable chip carrier from the conductive layer releases the first releasable chip carrier from the carrier foil layer.

13. The method of claim 1, further comprising:
   forming an adhesive layer between the first releasable chip carrier and the conductive layer; and
   activating the adhesive layer with the first activating source to facilitate the releasing.

14. The method of claim 13, wherein the adhesive layer is a double sided tape, and wherein the method further comprises an application process selected from the group consisting of applying a thermal release adhesive on one or both sides of the double sided tape and applying a UV release adhesive on one or both sides of the double sided tape.

15. A method for forming semiconductor packages comprising:
   providing a first releasable chip carrier attached to a conductive layer;
   forming a circuit layer on a surface of the conductive layer;
   applying a dielectric layer over a surface of the circuit layer;
   attaching a second releasable chip carrier to a surface of the dielectric layer;
   releasing, by a first activating source, the first releasable chip carrier from the conductive layer; and operationally testing first circuitry and second circuitry of the circuit layer.

16. The method of claim 15, wherein results of said operationally testing indicate that the first circuitry and the second circuitry are each operationally functional, and wherein said method further comprises:
   attaching a first semiconductor die to portions of the first circuitry of the circuit layer;
   attaching a second semiconductor die to portions of the second circuitry of the circuit layer;
   forming an encapsulating layer surrounding the first semiconductor die and the second semiconductor die;
   attaching a third releasable chip carrier to a surface of the encapsulating layer;
   releasing, by a second activating source, the second releasable chip carrier from the surface of the dielectric layer;
   removing portions of said dielectric layer thereby forming openings within the dielectric layer;
   forming a first group of ball grid array structures and a second group of ball array structures within the openings, wherein the first group of ball grid array structures are electrically connected to the first semiconductor die, wherein the second group of ball grid array structures are electrically connected to the second semiconductor die; and
   applying a laser cut between the first semiconductor die and the second semiconductor die and through the conductive layer, the circuit layer, the dielectric layer, and the encapsulating layer thereby forming a first semiconductor structure and a second semiconductor structure as independent singulated semiconductor structures.

17. A releasable carrier structure comprising:
   a first releasable chip carrier;
   a carrier conductive layer;
   a first releasable tape layer placed between the first releasable chip carrier and the carrier conductive layer, wherein the first releasable tape layer attaches the first releasable chip carrier to the carrier conductive layer, and wherein the first releasable tape layer is configured to release the first releasable chip carrier from the carrier conductive layer after being exposed to an activating source;
   a dielectric layer formed over a surface of a circuit layer formed over the carrier conductive layer;
   a second releasable chip carrier; and
   a second releasable tape layer placed between the second releasable chip carrier and the dielectric layer, wherein the second releasable tape layer attaches the second releasable chip carrier to the dielectric layer, and wherein the second releasable tape layer is configured to release the second releasable chip carrier from the dielectric layer after being exposed to the activating source.

18. The releasable carrier structure of claim 17, wherein the first releasable chip carrier and the second releasable chip carrier each comprise a size format selected from the group consisting of a panel size format and a strip size format.

19. The releasable carrier structure of claim 17, wherein the first releasable chip carrier and the second releasable chip carrier each comprise a panel size format.

20. The releasable carrier structure of claim 17, wherein the first releasable chip carrier comprises a panel size format, and wherein the second releasable chip carrier comprises a strip size format.

* * * * *